US010160905B2

(12) United States Patent
Li

(10) Patent No.: US 10,160,905 B2
(45) Date of Patent: Dec. 25, 2018

(54) BLUE-GREEN LIGHT-EMITTING PHOSPHOR, LIGHT-EMITTING ELEMENT, LIGHT-EMITTING DEVICE, AND WHITE-LIGHT-EMITTING DEVICE

(71) Applicant: DYDEN CORPORATION, Fukuoka (JP)

(72) Inventor: Chengzhou Li, Saga (JP)

(73) Assignee: DYDEN CORPORATION, Fukuoka (JP)

( * ) Notice: Subject to any disclaimer, the term of this patent is extended or adjusted under 35 U.S.C. 154(b) by 0 days.

(21) Appl. No.: 15/735,783

(22) PCT Filed: Jun. 15, 2016

(86) PCT No.: PCT/JP2016/067792
§ 371 (c)(1),
(2) Date: Dec. 12, 2017

(87) PCT Pub. No.: WO2017/006725
PCT Pub. Date: Jan. 12, 2017

(65) Prior Publication Data
US 2018/0171220 A1     Jun. 21, 2018

(30) Foreign Application Priority Data

Jul. 7, 2015    (JP) ................... 2015-136468

(51) Int. Cl.
*C09K 11/76*       (2006.01)
*C09K 11/71*       (2006.01)
(Continued)

(52) U.S. Cl.
CPC .............. *C09K 11/71* (2013.01); *C09K 11/08* (2013.01); *C09K 11/59* (2013.01); *C09K 11/64* (2013.01); *C09K 11/73* (2013.01); *H01L 33/50* (2013.01)

(58) Field of Classification Search
CPC .......... C09K 11/71; C09K 11/72; C09K 11/73
(Continued)

(56) References Cited

U.S. PATENT DOCUMENTS 4,458,176 A * 7/1984 Chenot ................. C09K 11/76
                                                                313/468
2003/0080341 A1* 5/2003 Sakano ................... B29C 67/08
                                                                 257/79

(Continued)

FOREIGN PATENT DOCUMENTS

JP    2004-253747 A    9/2004
JP    2010-021578 A    1/2010
(Continued)

OTHER PUBLICATIONS

International Search Report issued in Application No. PCT/JP2016/067792, dated Sep. 20, 2016.

*Primary Examiner* — Christopher Raabe
(74) *Attorney, Agent, or Firm* — Michael Best & Friedrich LLP

(57) ABSTRACT

An object of the invention is to provide a blue-green light-emitting phosphor having excellent high-temperature property and excellent light-emitting properties such as brightness and half width. The phosphor is constituted of a plurality of alkaline earth metal elements including a barium element, phosphoric acid and a halogen element, and Eu as an activator, in which the molar ratio of the barium element to the total content of the alkaline earth metal elements is larger than 60% and smaller than 95%, and upon irradiation with a near-ultraviolet ray, the blue-green light-emitting phosphor is excited to thereby emit blue-green visible light.

14 Claims, 23 Drawing Sheets

(51) Int. Cl.
*C09K 11/08* (2006.01)
*C09K 11/59* (2006.01)
*C09K 11/64* (2006.01)
*C09K 11/73* (2006.01)
*H01L 33/50* (2010.01)

(58) Field of Classification Search
USPC .......................................................... 313/503
See application file for complete search history.

(56) References Cited

U.S. PATENT DOCUMENTS

| | | | |
|---|---|---|---|
| 2010/0142189 A1* | 6/2010 | Hong | C09K 11/616 362/97.3 |
| 2010/0164365 A1* | 7/2010 | Yoshino | C09K 11/7734 313/503 |
| 2012/0212123 A1* | 8/2012 | Sakuta | C09K 11/7739 313/498 |

FOREIGN PATENT DOCUMENTS

| | | |
|---|---|---|
| JP | 2011-225822 A | 11/2011 |
| JP | 2011-225823 A | 11/2011 |
| WO | WO-2007/037120 A1 | 4/2007 |
| WO | WO-2009/107535 A1 | 9/2009 |
| WO | WO-2011/105571 A1 | 9/2011 |
| WO | WO-2012/114640 A1 | 8/2012 |

* cited by examiner

BLUE-GREEN LIGHT-EMITTING PHOSPHOR, LIGHT-EMITTING ELEMENT, LIGHT-EMITTING DEVICE, AND WHITE-LIGHT-EMITTING DEVICE

TECHNICAL FIELD

The present invention relates to a phosphor emitting blue-green visible light by near-ultraviolet ray excitation, particularly a blue-green light-emitting phosphor excellent in light-emitting properties, a light-emitting element, light-emitting device and white-light-emitting device using the blue-green light-emitting phosphor.

BACKGROUND ART

Phosphors, whose emission wavelengths vary depending on the types, find use in a wide variety of industries in accordance with the emission wavelengths.

In the lighting field, for example, white light can be theoretically obtained by mixing phosphors displaying light's three primary colors (red, blue, green). To obtain lighting simulating sun light for use in lighting, it has been desired to develop white light having further higher color-rendering property. Because of this, phosphors are required which can broadly emit light having a color displayed in the middle region of three primary colors of light.

Of the phosphors, what is strongly required at present, is a blue-green light-emitting phosphor, which emits blue-green visible light in the intermediate region between blue and green. Since the blue-green light-emitting phosphor emits blue-green visible light, it is an important phosphor which fills a valley formed between blue and green wavelength regions in the emission spectrum. If the blue-green light-emitting phosphor has a sufficient intensity and half width, it can realize white light (lighting) having further higher color-rendering property and capable of substituting for a blue phosphor.

As the blue-green light-emitting phosphor as mentioned above, a halophosphate phosphor is known, which contains an alkaline earth metal, phosphoric acid, a halogen and europium, as constituent elements. Although the blue-green light-emitting phosphor emits blue-green light, not only brightness and high-temperature property are insufficient but also half width is narrow. Thus, the light-emitting properties of the blue-green light-emitting phosphor had many points to be improved.

To improve the light-emitting properties of such a halophosphate phosphor, it has been proposed to add a large amount of alkaline earth metal, in particular, strontium (Sr) as a constituent element, thereby improving light-emitting properties. For this purpose, various types of phosphors have been suggested.

For example, as a conventional blue-green light-emitting phosphor, a phosphor containing Sr: M (M represent a metal element except Eu and Sr) in a ratio of a:b (a and b satisfy the conditions: $a+b \leq 5$ and $a \geq 0.1$ or $b \geq 3$), is known (see, Patent Literatures 1 and 2).

As another conventional blue-green light-emitting phosphor, a phosphor contains (Sr,Ca) and Ba, wherein a ratio of (Sr,Ca):Ba is defined as a:b (a and b satisfy conditions: $a+b=5-x$ ($0.3 \leq x \leq 1.2$) and $0.12 \leq b/(a+b) \leq 0.4$), is known (see, Patent Literature 3). As another conventional blue-green light-emitting phosphor, a phosphor containing (Sr,Ca) and Ba in a ratio of a:b (a and b satisfy the conditions: $a+b=5-x$ ($0.3 \leq x \leq 1.2$) and $0.05 \leq b/(a+b) \leq 0.6$), is known (see, Patent Literature 4).

As another conventional blue-green light-emitting phosphor, a phosphor containing Sr and Ba in a ratio of a:b (a and b satisfy the conditions: $a+b=5-x$ ($0.3 \leq x \leq 1.2$) and $0.1 \leq b/(a+b) \leq 0.6$), is known (see, Patent Literature 5). As another conventional blue-green light-emitting phosphor, a phosphor containing (Sr,Ca) and Ba in a ratio of a:b (a and b satisfy the conditions: $a+b=5-x$ ($0.3 \leq x \leq 1.2$) and $0.05 \leq b/(a+b) \leq 0.6$), is known (see Patent Literature 6).

CITATION LIST

Patent Literatures

Patent Literature 1: Japanese Patent Laid-Open No. 2004-253747

Patent Literature 2: Japanese Patent Laid-Open No. 2010-21578

Patent Literature 3: International Publication No. WO2012/114640

Patent Literature 4: International Publication No. WO2011/105571

Patent Literature 5: Japanese Patent Laid-Open No. 2011-225822 issue

Patent Literature 6: Japanese Patent Laid-Open No. 2011-225823 issue

SUMMARY OF INVENTION

Technical Problem

In the conventional blue-green light-emitting phosphors, performance degradation, such as deterioration of high-temperature property, is caused by high content of strontium (Sr). The high-temperature property is a very important property. If high-temperature property is poor, the phosphor easily deteriorates when it is used in high-temperature conditions. In addition, due to low durability, the phosphor is quickly used up, increasing maintenance cost. Likewise, such a phosphor has practical disadvantages.

Particularly, in lighting uses, high power and high-level continuous operation are required for phosphors. Because of this, phosphors must maintain high emission intensity (wide light-emitting area) even in high-temperature conditions (for example, a high temperature (condition) exceeding 100° C.); in other words, excellent high-temperature property.

The present invention was made in order to solve the aforementioned problems. An object of the invention is to provide a blue-green light-emitting phosphor having excellent high-temperature property and excellent light-emitting properties such as brightness and half width.

Solution to Problem

The present inventors conducted intensive studies. As a result, they focused on barium (Ba) belonging to the alkaline earth metal, as a constituent element of a halophosphate phosphor and formed a phosphor by significantly increasing the content of Ba more than ever within a predetermined range. They found that the phosphor, upon irradiation with a near-ultraviolet ray, emits blue-green visible light having a broad spectrum and exhibiting more excellent high-temperature property, brightness and half width than conventional phosphors. Based on the finding, the present invention was attained.

More specifically, the blue-green light-emitting phosphor disclosed in this application is a phosphor constituted of a plurality of alkaline earth metal elements including a barium element, phosphoric acid and a halogen element, and Eu as an activator, in which the molar ratio of the barium element to the total content of the alkaline earth metal elements is larger than 60% and smaller than 95%, and upon irradiation with a near-ultraviolet ray, the blue-green light-emitting phosphor is excited to thereby emit blue-green visible light.

The blue-green light-emitting phosphor disclosed in this application is, if necessary, represented by in a general formula:

$$Ba_b(Sr,Ca,Mg)_c(PO_4)_dX_e:Eu_a$$

where X represents a halogen element, $0<a<1.5$, $3.5 \le b \le 8.5$, $0 \le c \le 5.9$, $5.4 \le d \le 6.6$, $1.8 \le e \le 2.2$, $0.6 < b/(b+c) < 0.95$.

The light-emitting element disclosed in this application has a blue-green light-emitting phosphor as mentioned above. The light-emitting device disclosed in this application has a blue-green light-emitting phosphor as mentioned above. The white-light-emitting device disclosed in this application has a blue-green light-emitting phosphor as mentioned above, a red phosphor and a green phosphor, and may further optionally have a blue phosphor. The white-light-emitting device (disclosed in this application) is constituted of a first phosphor, which is a blue-green light-emitting phosphor as mentioned above and emits blue-green light of 430 to 500 nm, a second phosphor emitting green to yellow light of 500 to 580 nm, a third phosphor emitting red to deep red light of 580 to 700 nm and an LED element emitting near-ultraviolet light of 350 to 430 nm, and the first phosphor, second phosphor and third phosphor are directly or indirectly excited by light from the LED element to emit white light.

DESCRIPTION OF EMBODIMENTS

Figure 1A:
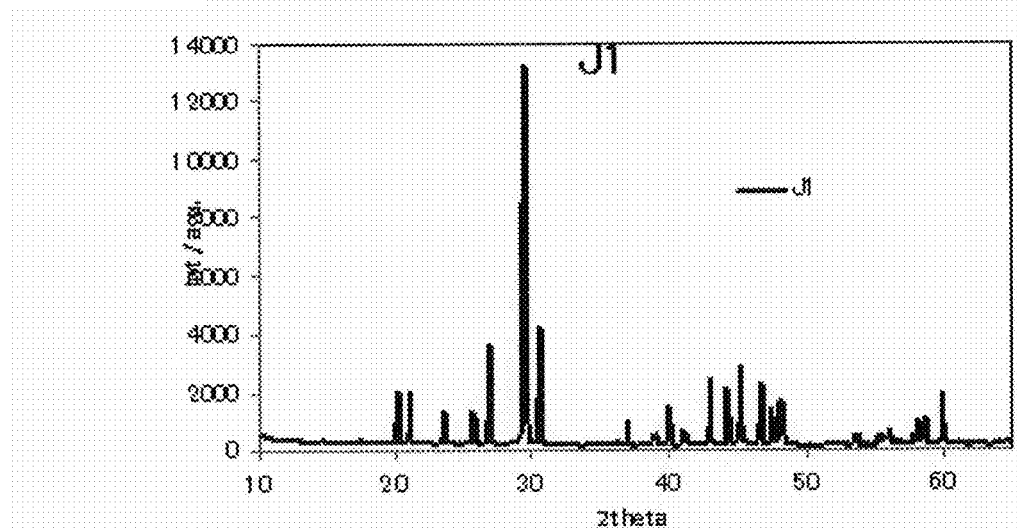
FIG. 1A to FIG. 1C show X-ray diffraction patterns of phosphors obtained in Examples 1 to 3 of the present invention.
Figure 1B:
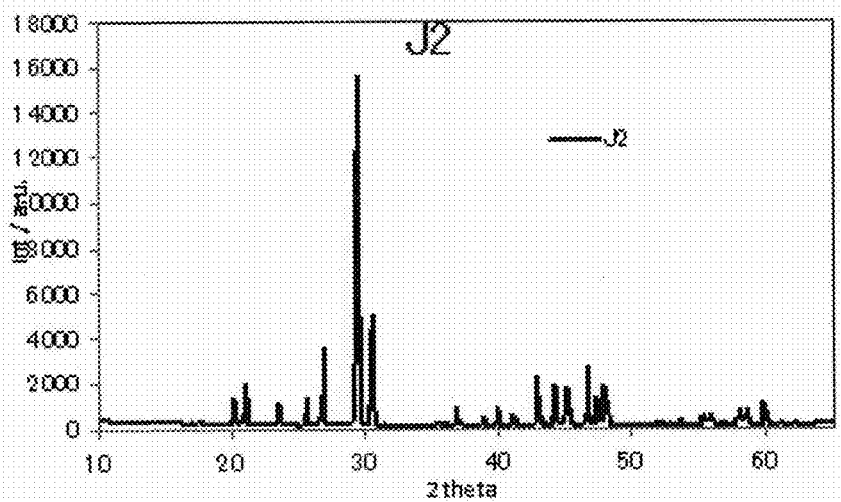
Figure 1C:
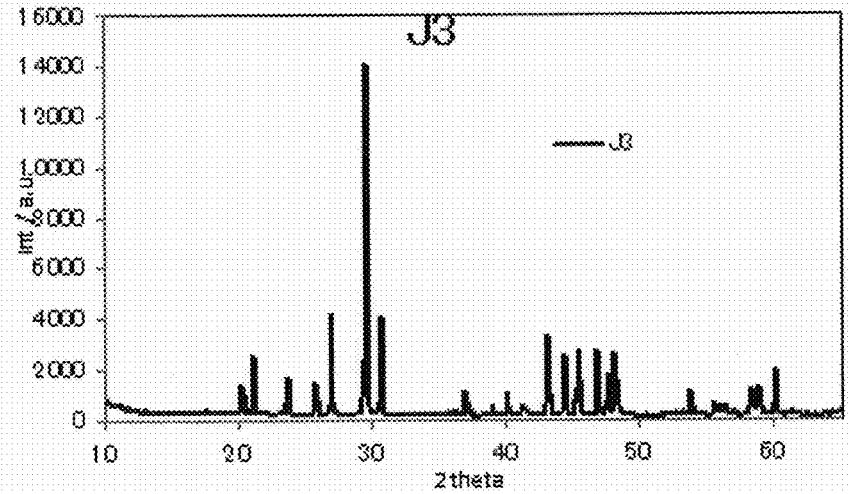
Figure 2A:
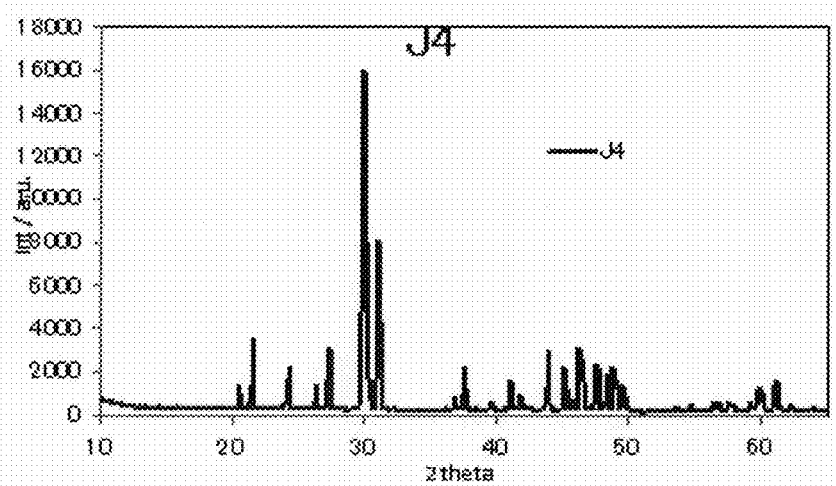
FIG. 2A to FIG. 2C show X-ray diffraction patterns of phosphors obtained in Examples 4 to 6 of the present invention
Figure 2B:
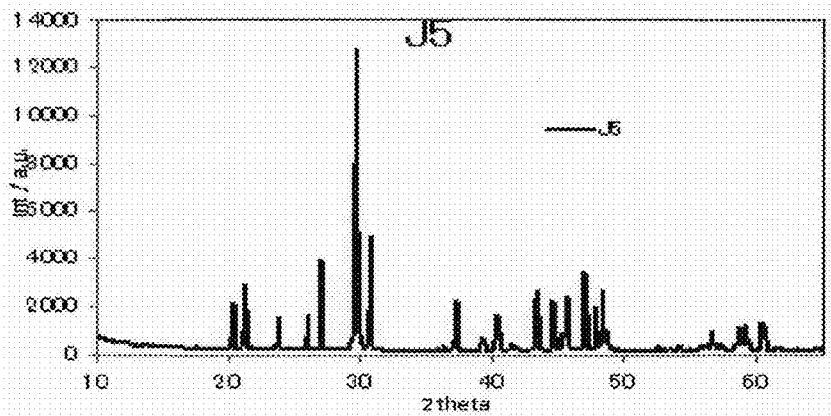
Figure 2C:
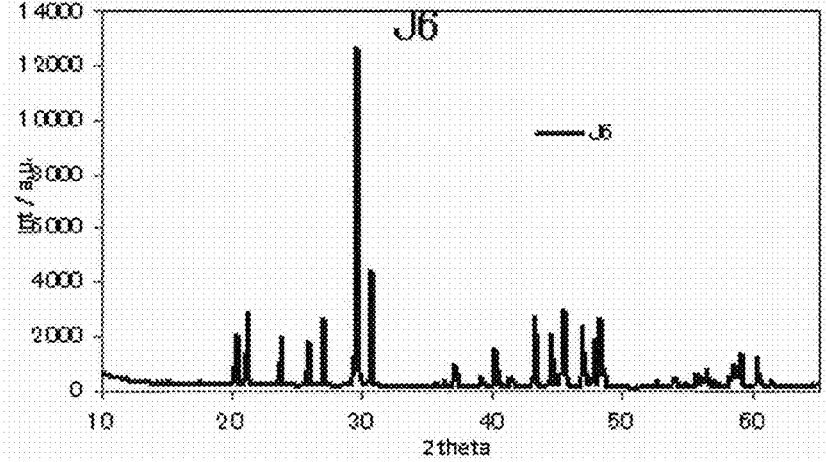
Figure 3A:
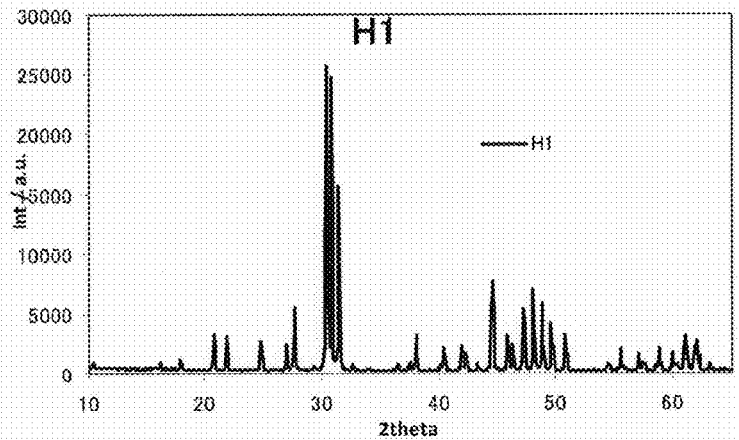
FIG. 3A to FIG. 3C show X-ray diffraction patterns of phosphors obtained in Comparative Examples 1 to 3 of the present invention.
Figure 3B:
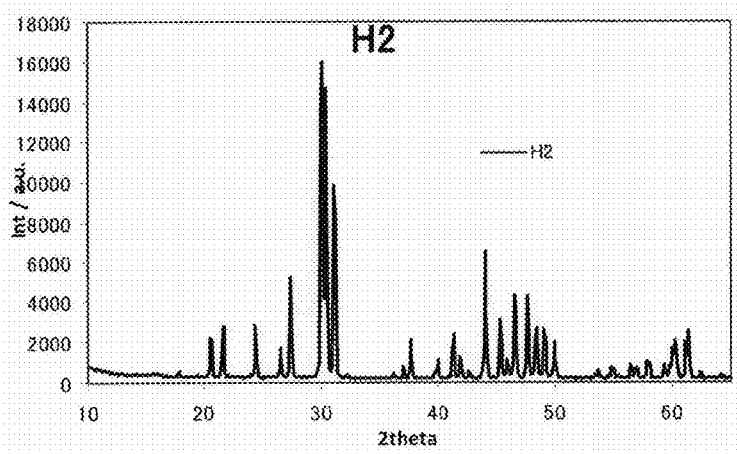
Figure 3C:
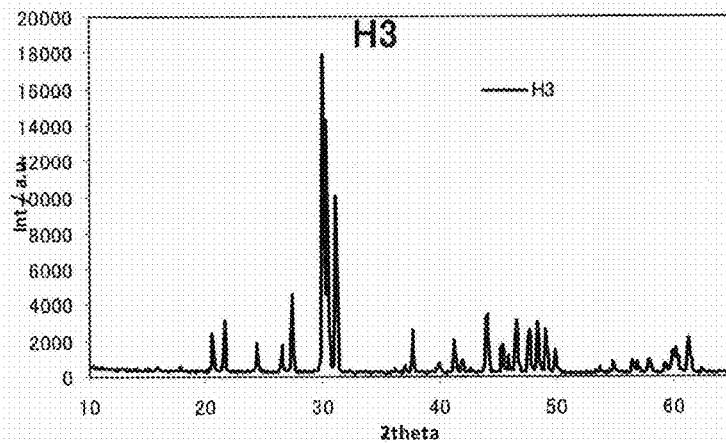
Figure 4A:
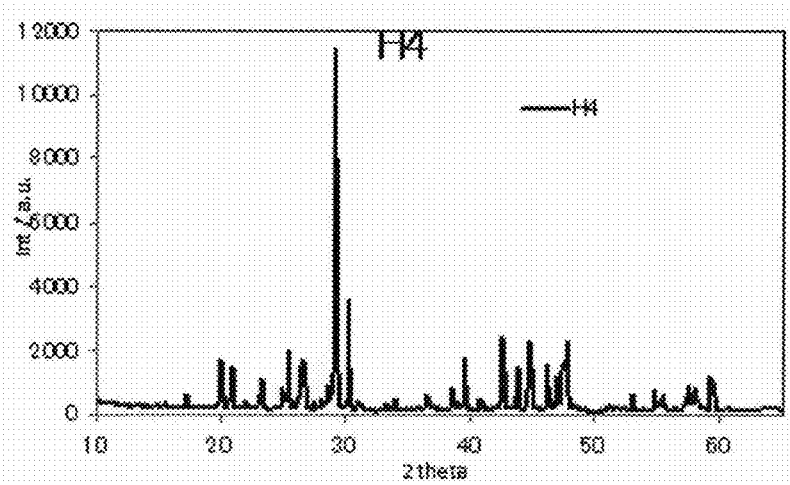
FIG. 4A to FIG. 4D show X-ray diffraction patterns of phosphors obtained in Comparative Examples 4 to 7 of the present invention.
Figure 4B:
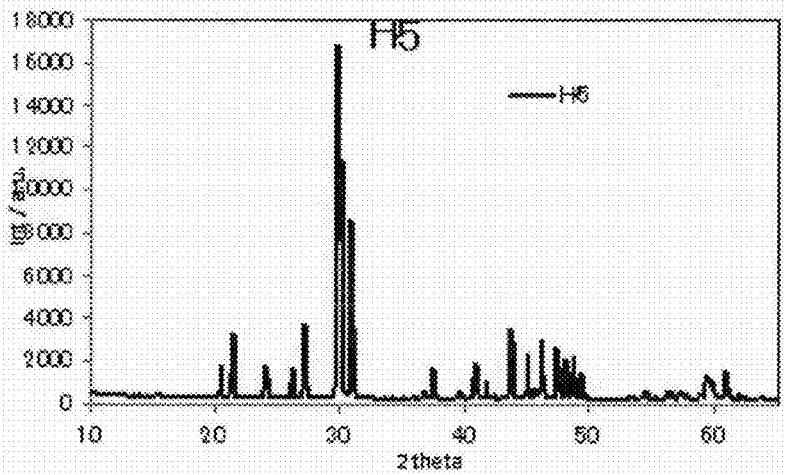
Figure 4C:
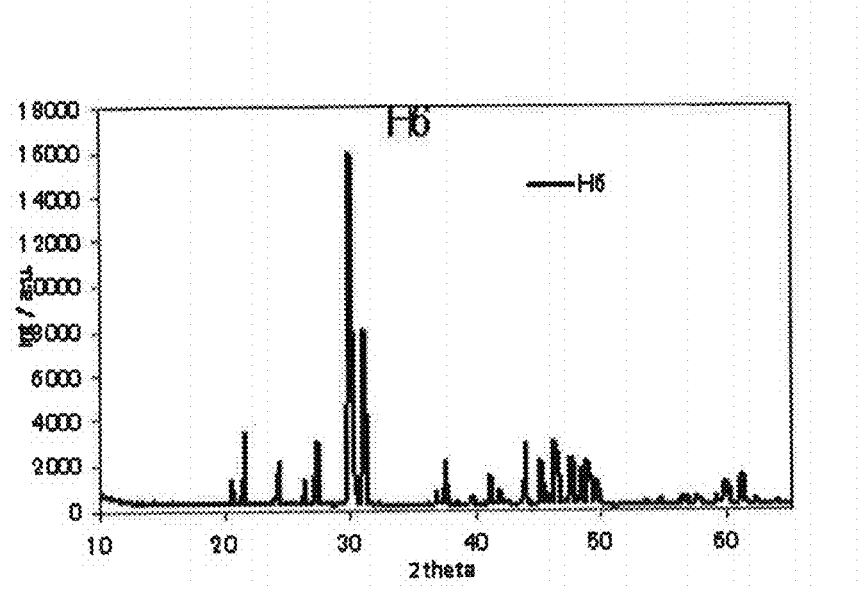
Figure 4D:
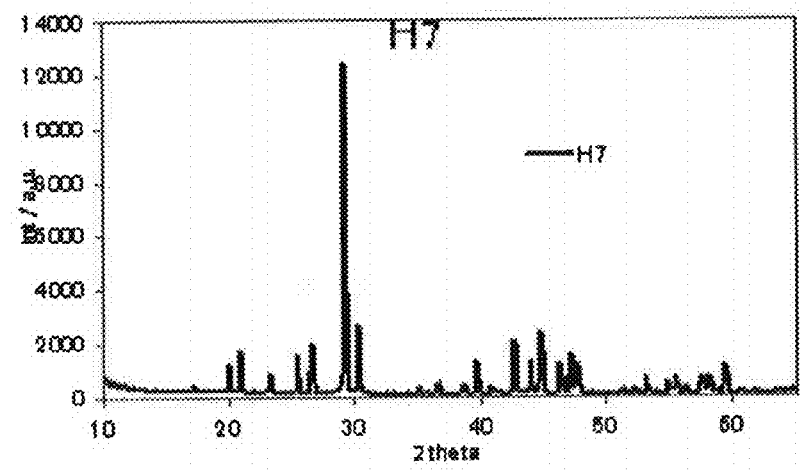

The blue-green light-emitting phosphor according to the present invention is a phosphor constituted of a plurality of alkaline earth metal elements including a barium element, phosphoric acid and a halogen element, and Eu as an activator, in which the molar ratio of the barium element to the total content of the alkaline earth metal elements is larger than 60% and smaller than 95%, and upon irradiation with a near-ultraviolet ray, the blue-green light-emitting phosphor is excited to thereby emit blue-green visible light.

The near-ultraviolet ray to be applied as an excitation source is not particularly limited as long as the wavelength thereof falls within a general wavelength region of near-ultraviolet rays of 200 nm or more; for example, a near-ultraviolet ray having a wavelength region of 370 nm to 420 nm can be used. The blue-green light-emitting phosphor according to the present invention, upon irradiation with the near-ultraviolet ray, emits blue green visible light having a broad emission spectrum having an emission peak within a wavelength region of 470 nm to 490 nm and having high color-rendering property.

As described above, the blue-green light-emitting phosphor according to the present invention, which emits blue green visible light having a broad emission spectrum, can be used in combination with other phosphors known in the art to form a light-emitting element or a light-emitting device which can be used as a light source emitting white light close to sun light.

According to the present invention, blue-green visible light having such a broad emission spectrum and excellent temperature property (high-temperature property) can be obtained. However, in conventional phosphors, in which the molar ratio of a barium element to the all alkaline earth metal elements is 60% or less and 95% or more (the phosphors disclosed in Patent Literatures 1 to 6, all have a molar ratio of a barium element of 60% or less), excellent properties, in particular, temperature property, cannot be obtained. This is also confirmed by the present inventors (see Examples described later).

More specifically, to describe the high-temperature property of a phosphor, if the molar ratio of a barium element to the all alkaline earth metal elements is 60% or less, the light-emitting area of a phosphor remains low; however, if the molar ratio is larger than 60%, the light-emitting area of the phosphor sharply increases in proportional to an increase in molar ratio of the barium element. Whereas, if the molar ratio of the barium element exceeds 95%, the light-emitting area of the phosphor sharply decreases. In the blue-green light-emitting phosphor according to the present invention, however, a decrease of emission intensity by heat is suppressed even in high temperature conditions. It has been confirmed that the phosphor of the invention has high heat resistance (see Examples described later).

A mechanism to produce such an excellent effect has not yet been specifically elucidated; however, it is presumed that a barium element, which is contained as a constituent element in the blue-green light-emitting phosphor according to the present invention in a molar ratio of 60% or larger and smaller than 95%; in other words, a high-content barium element, mutually interacts with other alkaline earth metal elements on the atomic level and produces a favorable effect on light emission; in particular, these elements produce a specific crystal structure, based on which the phosphor exhibits high-temperature property.

Actually, in view of crystal structure, the following facts were confirmed: if the molar ratio of a barium element to the all alkaline earth metal elements is 60% or less, a crystal phase (SCA phase: crystal structure mainly consisting of Sr) exhibiting an X-ray diffraction pattern, which has three diffraction peaks derived from the (211) plane, (112) plane, and (300) plane at a 2θ value of about 30°, is shown; in contrast, if the molar ratio of a barium element to the all alkaline earth metal elements is larger than 60%, a crystal phase (BCA phase: crystal structure mainly consisting of Ba) having two diffraction peaks derived from the (112) plane and (300) plane, is shown. Likewise, a crystal structural change was confirmed (see, Examples described later).

According to an embodiment of the present invention, a blue-green light-emitting phosphor is represented by the following general formula:

$$Ba_b(Sr,Ca,Mg)_c(PO_4)_dX_e:Eu_a$$

where X represents a halogen element, $0<a<1.5$; $9.5 \leq a+b+c \leq 10.5$; $5.4 \leq d \leq 6.6$; $1.8 \leq e \leq 2.2$; $0.6 < b/(b+c) < 0.95$.

The composition of individual constituent elements in the general formula is specified from composition by mole in a starting material. More specifically, a, b, c, d, and e defined in the general formula respectively represent the composition by mole of Eu, Ba, (Sr,Ca,Mg), (PO$_4$), and X in the starting material.

The expression "(Sr,Ca,Mg)" means that at least one element of Sr, Ca, and Mg is contained. More specifically, the expression "(Sr,Ca,Mg)" may be a case where any one element of Sr, Ca and Mg is contained; a case where two elements of Sr, Ca and Mg are contained or a case where all elements of Sr, Ca and Mg are contained.

It is preferable that the blue-green light-emitting phosphor according to the present invention contains Ca and Mg in order to obtain a broader light-emitting region. The content of Ca, however, was a cause of deteriorating temperature property in conventional phosphors; whereas, in the blue-green light-emitting phosphor according to the present invention, even if Ca is contained, excellent properties, i.e., a broader light-emitting region, can be obtained while maintaining temperature property.

It is also preferable that 50 mol % or more of the halogen elements constituting the blue-green light-emitting phosphor according to the present invention is constituted of a chlorine element. If 50 mol % or more of the halogen elements is constituted of a chlorine element, light-emitting properties are improved such that a satisfactory light-emitting area and chromaticity region are maintained.

It is also preferable that the blue-green light-emitting phosphor according to the present invention contains at least one co-activating element selected from the group of rare earth metals and transition metals consisting of Sc, Y, La, Gd, Tb, Lu, Pr, Ce, Cr, V, Mn and Zn. If such a co-activating element is contained, the half width and maximum excitation wavelength can be improved, and a satisfactory chromaticity region can be produced.

The blue-green light-emitting phosphor according to the present invention can be constituted of a blue-green light-emitting phosphor as mentioned above, for example, in an amount of 10 to 90 wt % and at least one phosphor selected from the group of blue phosphors and green phosphors consisting of BaMgAl$_{10}$O$_{17}$:Eu, (Ba, Sr)$_3$MgSi$_3$O$_8$:Eu, Sr$_{10}$(PO$_4$)$_6$Cl$_2$:Eu, Sr$_2$P$_2$O$_7$:Eu, Ca$_2$PO$_4$Cl:Eu, Ba$_2$PO$_4$Cl:Eu, (Ba,Sr)$_2$SiO$_4$:Eu and (Ba,Sr,Ca)Al$_2$O$_4$:Eu.

With this constitution, it is confirmed that an excellent half width (FWHM) of 50 to 100 nm is provided and excellent light-emitting properties, i.e. a rectangle chromaticity region defined by a chromaticity value x=0.10 to 0.25 and a chromaticity value y=0.05 to 0.40 is formed (see, Examples described later).

A method for synthesizing the blue-green light-emitting phosphor according to the present invention having such excellent properties is not particularly limited; however, the blue-green light-emitting phosphor can be produced, for example, by homogeneously mixing a Eu source serving as a light emission center, an alkaline earth source, a phosphorus source and a halogen source by a dry or wet method and calcinating the mixture in a reducing atmosphere.

The individual starting compounds are not particularly limited as long as a compound containing at least one of constituent element (for example, Ba, Sr, Ca, Mg, P, a halogen element, and Eu) of the blue-green light-emitting phosphor according to the present invention is used so as to obtain a blue-green light-emitting phosphor containing desired constituent elements (containing every constituent element without fail).

As an example of such a starting compound, an oxide, a hydroxide or a carbide containing constituent elements of a blue-green light-emitting phosphor can be used. For example, in the case of a barium (i.e., one of constituent elements of a blue-green light-emitting phosphor), e.g., barium oxide, barium hydroxide or barium carbonate can be used as a starting compound. This is because, in producing of the blue-green light-emitting phosphor according to the present invention, individual starting compounds are subjected to a heat treatment, with the result that constituent elements alone finally remain (from the starting compounds) by the heat treatment. Thus, the blue-green light-emitting phosphor according to the present invention can be produced without being affected by the types of starting compounds.

Examples of the Eu source and alkaline earth source include oxides, hydroxides, carbonates, sulfates, nitrates, organic acid salts and halogenates of Eu, Ba, Sr, Ca and Mg. Examples of the phosphorus source include ammonium phosphate, ammonium dihydrogen phosphate, ammonium monohydrogen phosphate, alkaline earth phosphate, alkaline earth hydrogen phosphate, phosphorus oxide, phosphoric acid and condensed phosphoric acid. Examples of the halogen source include a halogenated alkaline earth salt, a halogenated alkaline earth hydrate and an ammonium halide.

The blue-green light-emitting phosphor according to the present invention can be synthesized by a method primarily employing, for example, a self-flux reaction. More specifically, a starting compound, i.e., a halogen source, is used as a flux for a calcination reaction and individual starting compounds are excessively supplied within the range that the excellent effect of the present invention is not undermined. In this manner, the excellent properties of the present invention tend to be easily obtained. Note that it is desirable that a composition of a product to be synthesized from the excessive contents is estimated in advance.

As the starting compounds, for example, anhydrous $BaCl_2$ and $SrCl_2$ can be used in order to easily obtain excellent properties. However, the starting compounds are not limited to these, for example, hydrates can be used. As an example of a starting compound, a compound having a mixing ratio of $BaHPO_4:SrHPO_4=BaCl_2:SrCl_2$ can be mentioned.

The blue-green light-emitting phosphor according to the present invention can be used for a light-emitting element having the blue-green light-emitting phosphor. The blue-green light-emitting phosphor according to the present invention can be also used for a light-emitting device having the blue-green light-emitting phosphor. In particular, the blue-green light-emitting phosphor according to the present invention can be used for a white-light-emitting device having the blue-green light-emitting phosphor, a red phosphor and a green phosphor. In this case, it was confirmed that white light having a broad light emission spectrum and high color-rendering property never ever obtained in the art can be obtained. Further, in the white-light-emitting device, if the content or emission color (chromaticity) of the blue-green light-emitting phosphor according to the present invention is controlled, which leads to controlling the wavelength band and wavelength intensity of the blue-green light-emitting phosphor, with the result that the color temperature of the white light to be obtained can be freely controlled. Owing to the control, for example, white light with a bluish tone close to fluorescent color to white light with an orangish tone close to the color of a light bulb (even if these fall within the same white light but differ in tone), can be selectively obtained.

According to an embodiment of the present invention, the light-emitting device is constituted of the blue-green light-emitting phosphor according to the present invention and a light-emitting element, which emits near-ultraviolet light. In the device, the blue-green light-emitting phosphor according to the present invention is irradiated with a near-ultraviolet ray from the light-emitting element, which emits near-ultraviolet light, to efficiently emit blue-green visible light. Use of the light-emitting device according to the present invention is not particularly limited. The device can find use in a wide variety of fields and can be used, for example, as various types of lighting apparatuses such as a lighting apparatus for plant breeding.

According to an embodiment of the present invention, the white-light-emitting device is constituted of a first phosphor, which is a blue-green light-emitting phosphor according to the present invention and emits blue-green light of 430 to 500 nm, a second phosphor emitting green to yellow light of 500 to 580 nm, a third phosphor emitting red to deep red light of 580 to 700 nm and an LED element emitting near-ultraviolet light of 350 to 430 nm, in which the first phosphor, second phosphor and third phosphor are directly or indirectly excited by light from the LED element to emit white light.

As the first phosphor, a blue-green light-emitting phosphor obtained in any one of Examples can be used.

The second phosphor is not particularly limited as long as it is a phosphor emitting light in a green wavelength band; and a phosphor containing a Eu-activated alkaline earth silicate-based phosphor or an alkaline earth silicate nitride-based phosphor is preferably used. Examples thereof include $(Ba,Sr,Ca,Mg)_2SiO_4:Eu$ (BOSE), $Si_{6-z}Al_zO_zN_{8-z}$ (β SiAlON), $(Ba, Sr) Si_2O_2N_2$, $(Ba, Sr, Ca) MgAl_{10}O_{17}:Eu^{2+}, Mn^{2+}$ (BAMN) and $(Ca, Sr)_8Mg (SiO_4)_4Cl_2:Eu$.

The third phosphor is not particularly limited as long as it is a phosphor emitting color in a red to deep red wavelength band. A phosphor containing at least one of a Eu-activated alkaline earth oxynitride phosphor, a Eu-activated alkaline earth silicate-based phosphor and a Mn-activated fluoride complex red phosphor is preferably used. Examples thereof include $(Ba,Sr,Ca)_3SiO_5:Eu$ (for example, $Sr_3SiO_5:Eu$ (SSE)), $(Ba, Sr, Ca)_2(Si,Al)_5N_8:Eu$, $(Ca, Sr) AlSi(O,N)_3$, $(Sr,Ca)AlN_3:Eu$ (SCASN), $K_2(Si,Ge,Ti)F_6:Mn^{4+}$ (KSF) and $Li(Eu,RE)W_2O_8$ (where RE includes at least one of Sc, Y, La, Gd and Lu) (LEW).

It is confirmed that the white-light-emitting device according to the present invention has high color-rendering property and is also quantitatively confirmed that the device has excellent property based on a general color-rendering index (Ra) or color-rendering index (CRI) of 95 or more. The color-rendering property refers to an index indicating the effect of a light-source spectrum on the color appearance of an object. The color-rendering property can be quantitatively evaluated by converting the difference between the light of interest and sun light into a numerical value (sun light is specified as a reference value of 100). Note that, as the general color-rendering index (Ra) or color-rendering index (CRI) becomes closer to 100, it is evaluated that the color-rendering property is higher. Since the white-light-emitting device of the present invention has such excellent properties, the device can be used in a wide variety of light sources such as a backlight source of a wide color gamut and an illumination light source having high color-rendering.

The white-light-emitting device according to the present invention is constituted, without requiring an additional light source emitting blue light, based on the mechanism where the color temperature of white light changes depending on the content of a blue green component contained in the blue-green light-emitting phosphor (BCA) according to the present invention. This is an excellent characteristic. More specifically, a conventional blue-green light-emitting phosphor has been considered for making up for blue-green light of a white-light-emitting device; however, in the blue-green light-emitting phosphor according to the present invention, the blue-green light-emitting phosphor can be used as an alternative substance for the blue phosphor itself. In contrast, the white-light-emitting device of the present invention can employ another blue phosphor. In this case, pure blue color derived from the blue phosphors and blue-green derived from the blue-green light-emitting phosphor according to the present invention are superimposed to successfully obtain white light further closer to sun light. Further, the white-light-emitting device of the present invention makes it possible to prepare new blue-green by controlling the mixing ratio of blue color and blue-green color. In this manner, a white light source having variety color temperatures can be produced (see, Examples described later).

The features of the present invention will be further clearly described by way of Examples below; however, the present invention is not limited by Examples.

Example 1

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.5:8.0:1.5:6:2 and mixed by use of a mortar. The mixture was placed in a crucible made of alumina and kept in an electric furnace at 900° C. for 2 hours in the atmosphere, ground, sieved, and further kept in a nitrogen atmosphere containing 5% hydrogen gas at 1150° C. for 5 hours for calcination. The calcined product was washed with water, dried and classified to obtain a blue-green light-emitting phosphor corresponding to $Eu_{0.5}Ba_{8.0}Sr_{1.5}(PO_4)_6Cl_2$. The X-ray diffraction pattern of the phosphor was measured by using an X ray diffraction device (XRD6100, manufactured by Shimadzu Corporation) employing CuKα ray as a radiation source. Light-emitting properties of the phosphor excited at 400 nm were measured by a fluorescence spectrophotometer (FP6500, Manufactured by JASCO).

Example 2

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.5:8.0:1.5:6:2, and then, the same procedure as in Example 1 was repeated to produce a blue-green light-emitting phosphor corresponding to $Eu_{0.5}Ba_{8.4}Sr_{1.1}(PO_4)_6Cl_2$ and the X-ray diffraction pattern and light-emitting properties of the phosphor were obtained.

Example 3

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.6:7.7:1.7:6:2, and then, the same procedure as in Example 1 was repeated to produce a blue-green light-emitting phosphor corresponding to $Eu_{0.6}Ba_{7.7}Sr_{1.7}(PO_4)_6Cl_2$, and the X-ray diffraction pattern and light-emitting properties of the phosphor were obtained.

Example 4

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.6:8.1:1.3:6:2, and then, the same procedure as in Example 1 was repeated to produce a blue-green light-emitting phosphor corresponding to $Eu_{0.6}Ba_{8.1}Sr_{1.3}(PO_4)_6Cl_2$, and the X-ray diffraction pattern and light-emitting properties of the phosphor were obtained.

Example 5

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.6:6.5:2.9:6:2, and then, the same procedure as in Example 1 was repeated to produce a blue-green light-emitting phosphor corresponding to $Eu_{0.6}Ba_{6.5}Sr_{2.9}(PO_4)_6Cl_2$, and the X-ray diffraction pattern and light-emitting properties of the phosphor were obtained.

Example 6

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.6:7.4:2.0:6:2, and then, the same procedure as in Example 1 was repeated to produce a blue-green light-emitting phosphor corresponding to $Eu_{0.6}Ba_{7.4}Sr_{2.0}(PO_4)_6Cl_2$, and the X-ray diffraction pattern and light-emitting properties of the phosphor were obtained.

Comparative Example 1

A phosphor was formed of a composition containing no Ba. Starting materials, $Eu_2O_3$, $SrCO_3$, $SrHPO_4$ and $SrCl_2$ were weighed such that the final molar ratio of Eu:Sr:P:Cl was 0.5:9.5:6:2, and then, the same procedure as in Example 1 was repeated to produce a blue-green light-emitting phosphor corresponding to $Eu_{0.5}Sr_{9.5}(PO_4)_6Cl_2$, and the X-ray diffraction pattern and light-emitting properties of the phosphor were obtained.

Comparative Example 2

Starting materials, $Eu_2O_3$, $BaCO_3$, $SrCO_3$, $BaHPO_4$, $SrHPO_4$, $BaCl_2$ and $SrCl_2$ were weighed such that the final molar ratio of Eu:Ba:Sr:P:Cl was 0.5:2.2:7.3:6:2, and then, the same procedure as in Example 1 was repeated to produce a blue-green light-emitting phosphor corresponding to $Eu_{0.5}Ba_{2.2}Sr_{7.3}(PO_4)_6Cl_2$, and the X-ray diffraction pattern and light-emitting properties of the phosphor were obtained.

Comparative Example 3

Starting materials, $Eu_2O_3$, $BaCO_3$, $SrCO_3$, $BaHPO_4$, $SrHPO_4$, $BaCl_2$, $SrCl_2$ were weighted such that the final molar ratio of Eu:Ba:Sr:P:Cl was 0.6:3.5:5.9:6:2, and then, the same procedure as in Example 1 was repeated to produce a blue-green light-emitting phosphor corresponding to $Eu_{0.6}Ba_{3.5}Sr_{5.9}(PO_4)_6Cl_2$, and the X-ray diffraction pattern and light-emitting properties of the phosphor were obtained.

Comparative Example 4

A phosphor was formed of a composition containing no Sr. Starting materials, $Eu_2O_3$, $BaCO_3$, $BaHPO_4$, $SrHPO_4$, $BaCl_2$ and $SrCl_2$ were weighted such that the final molar ratio of Eu:Ba:Sr:P:Cl was 0.6:9.4:6:2, and then, the same procedure as in Example 1 was repeated to produce a blue-green light-emitting phosphor corresponding to $Eu_{0.6}Ba_{9.4}(PO_4)_6Cl_2$, and the X-ray diffraction pattern and light-emitting properties of the phosphor were obtained.

Comparative Example 5

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.5:4.2:5.3:6:2, and then, the same procedure as in Example 1 was repeated to produce a blue-green light-emitting phosphor corresponding to $Eu_{0.5}Ba_{4.2}Sr_{5.3}(PO_4)_6Cl_2$ and the X-ray diffraction pattern and light-emitting properties of the phosphor were obtained.

Comparative Example 6

A phosphor was formed of a composition containing Ca and Mg. Starting materials, $Eu_2O_3$, $BaCO_3$, $SrCO_3$, $CaCO_3$, $Mg(OH)_2$, $BaHPO_4$, $SrHPO_4$, $BaCl_2$ and $SrCl_2$ were weighted such that the final molar ratio of Eu:Ba:Sr:Ca:Mg:P:Cl was 0.3:5.0:3.0:1.5:0.2:6:2 and then, the same procedure as in Example 1 was repeated to produce a blue-green light-emitting phosphor corresponding to $Eu_{0.3}Ba_{5.0}Sr_{3.0}Ca_{1.5}Mg_{0.2}(PO_4)_6Cl_2$ and the X-ray diffraction pattern and light-emitting properties of the phosphor were obtained.

Comparative Example 7

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.3:9.25:0.45:6:2, and then, the same procedure as in Example 1 was repeated to produce a blue-green light-emitting phosphor corresponding to $Eu_{0.3}Ba_{9.25}Sr_{0.45}(PO_4)_6Cl_2$ and the X-ray diffraction pattern and light-emitting properties of the phosphor were obtained.

Figure 5A:
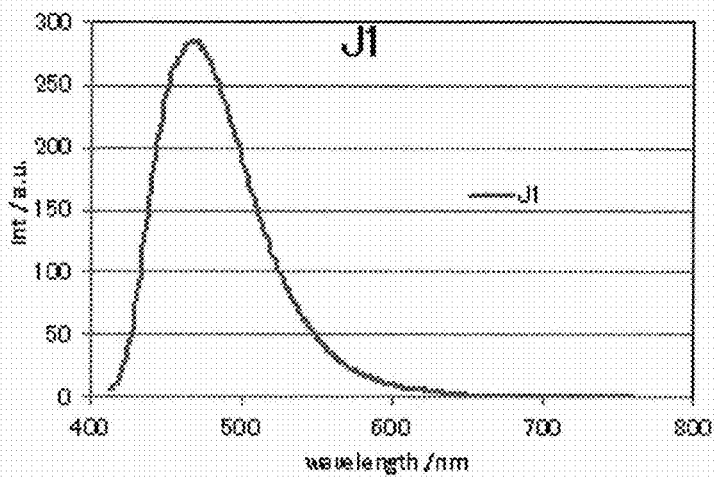
FIG. 5A to FIG. 5C show graphs showing light-emitting properties of phosphors obtained in Examples 1 to 3 of the present invention.
Figure 5B:
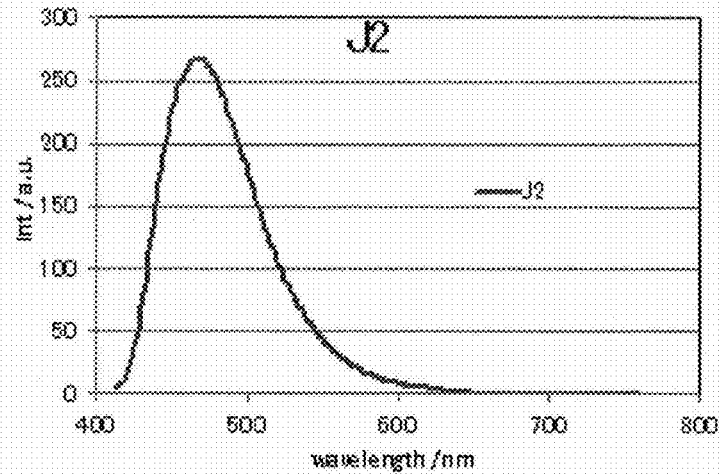
Figure 5C:
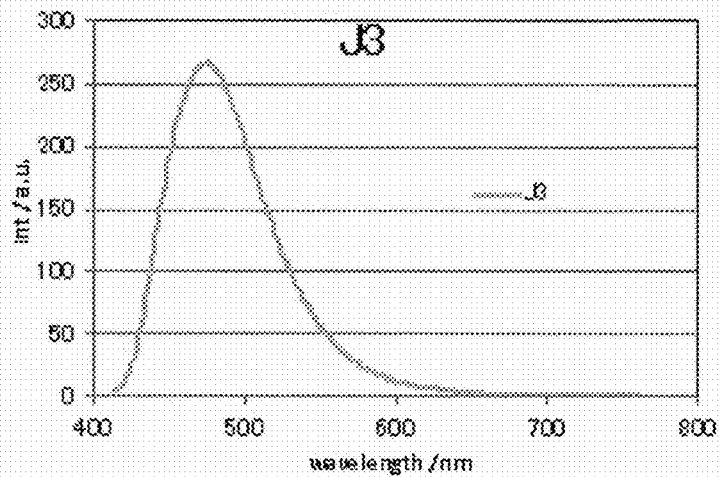
Figure 6A:
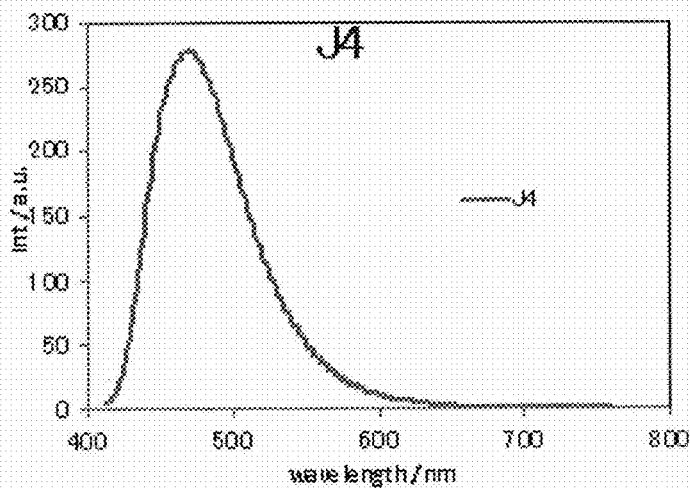
FIG. 6A to FIG. 6C show graphs showing light-emitting properties of phosphors obtained in Examples 4 to 6 of the present invention.
Figure 6B:
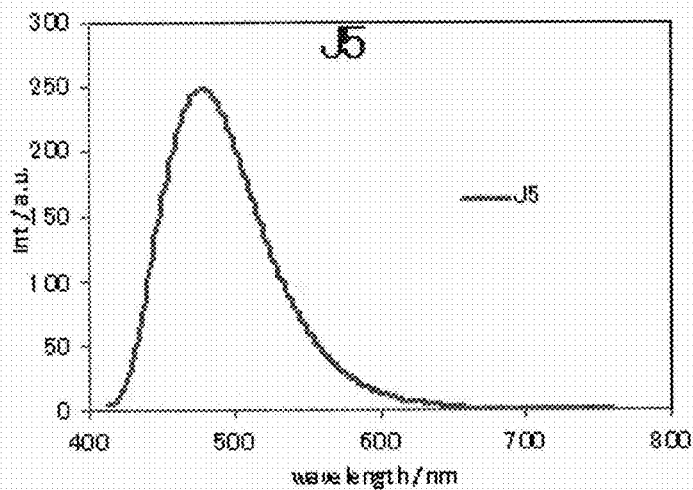
Figure 6C:
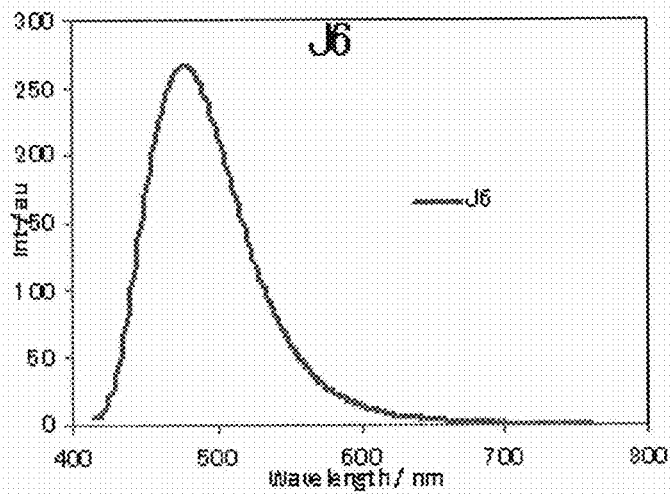
Figure 7A:
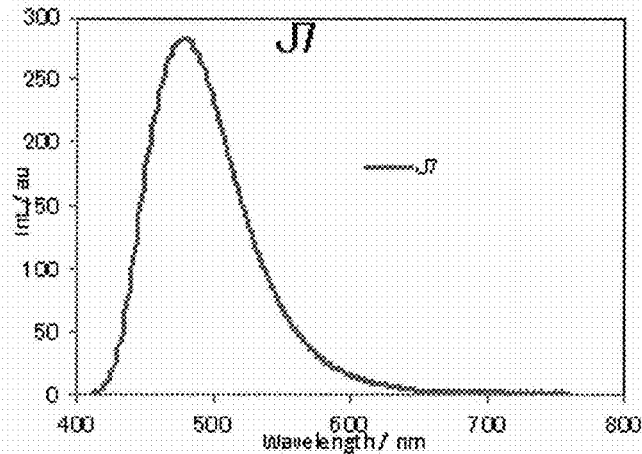
FIG. 7A to FIG. 7C show graphs showing light-emitting properties of phosphors obtained in Examples 7 to 9 of the present invention.
Figure 7B:
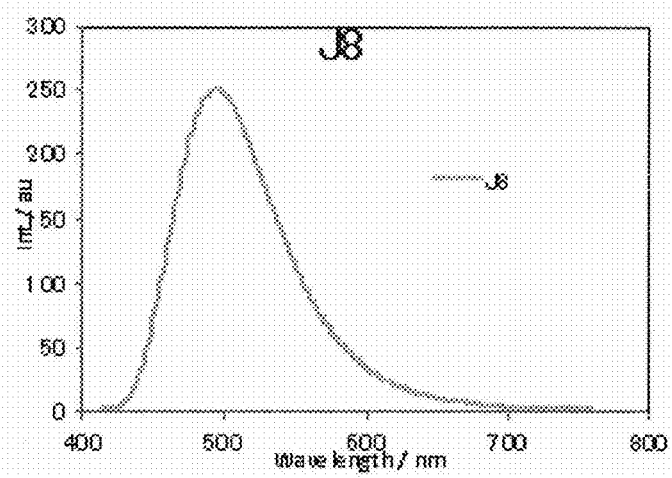
Figure 7C:
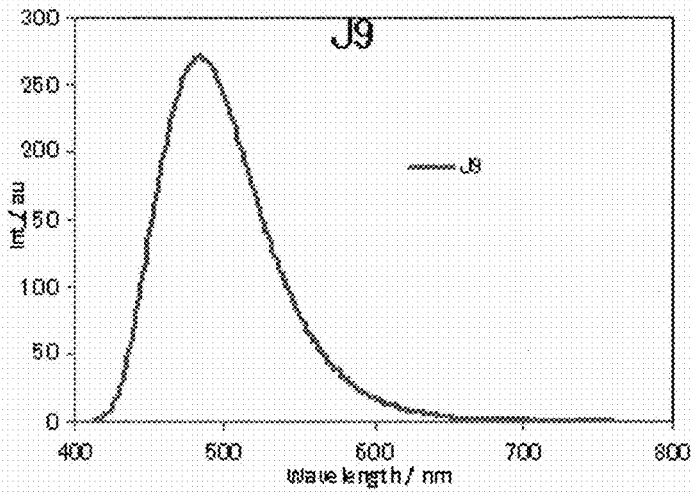
Figure 8A:
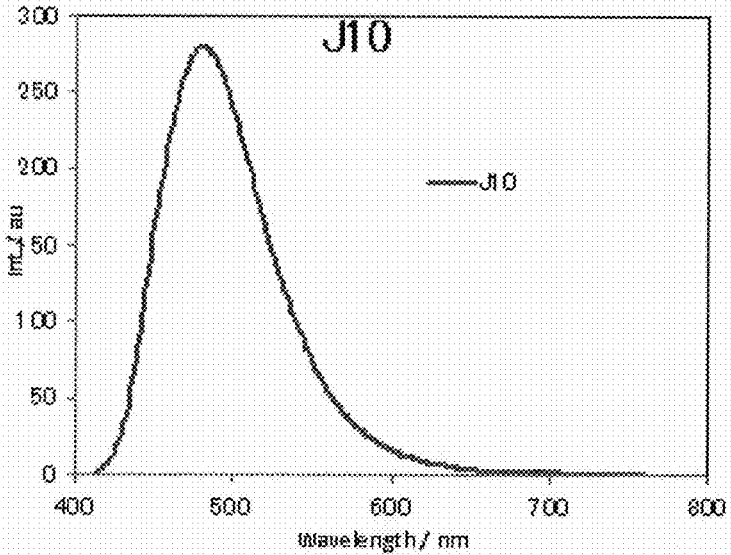
FIG. 8A to FIG. 8C shows graphs showing light-emitting properties of phosphors obtained in Examples 10 to 12 of the present invention
Figure 8B:
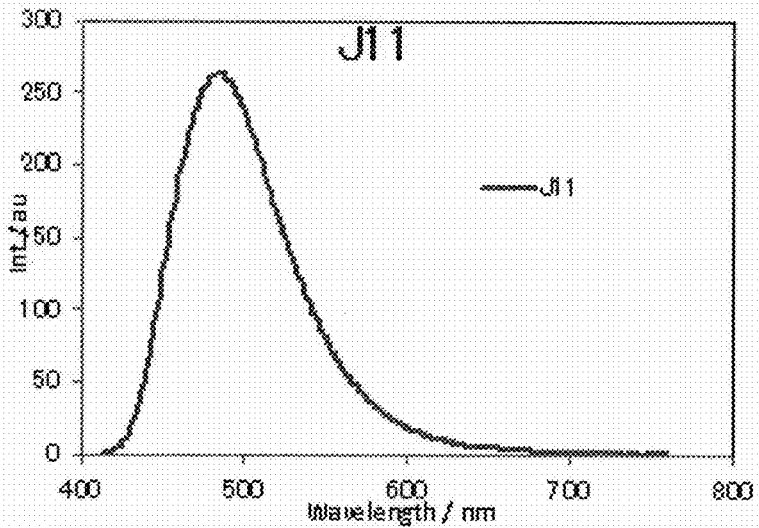
Figure 8C:
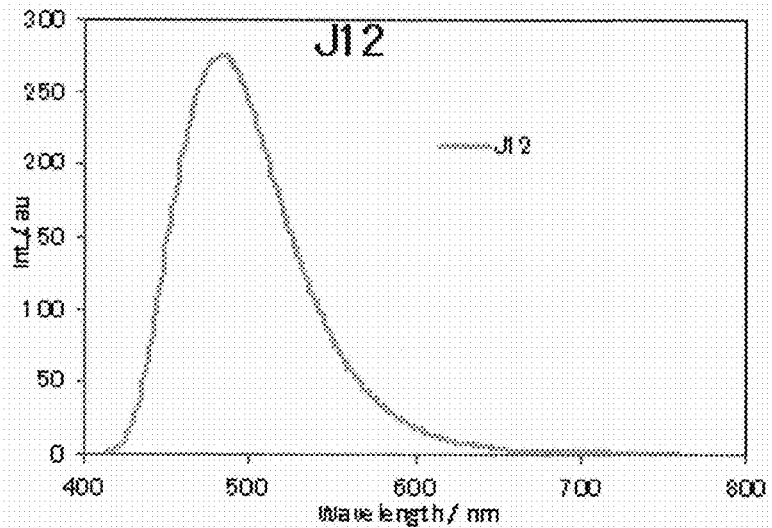
Figure 9A:
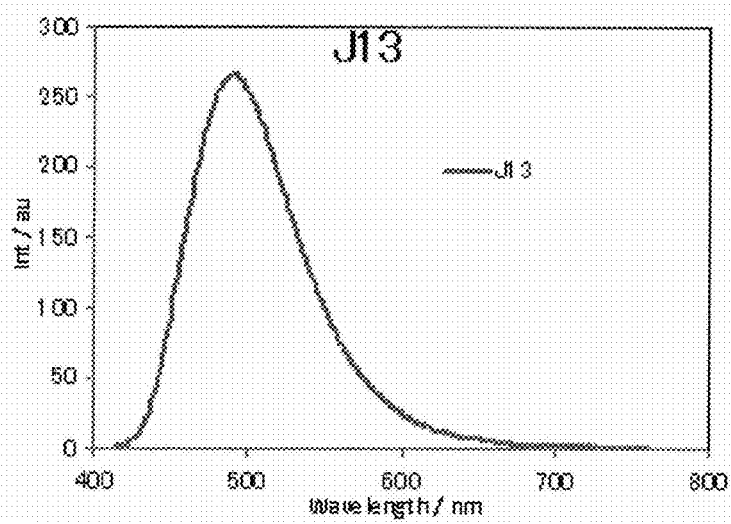
FIG. 9A to FIG. 9C show graphs showing light-emitting properties of phosphors obtained in Examples 13 to 15 of the present invention.
Figure 9B:
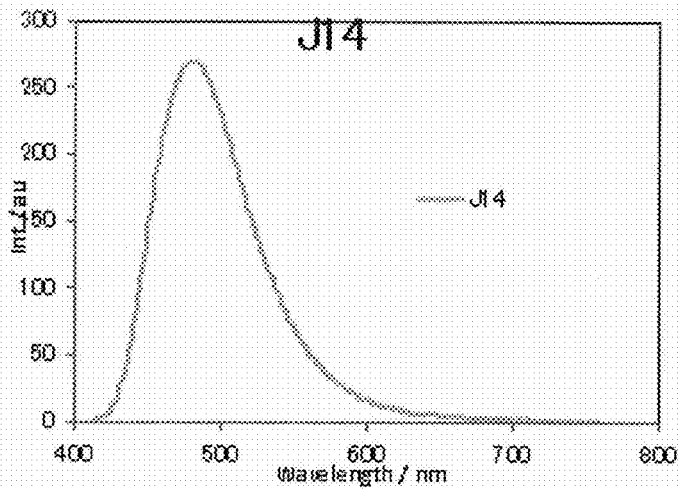
Figure 9C:
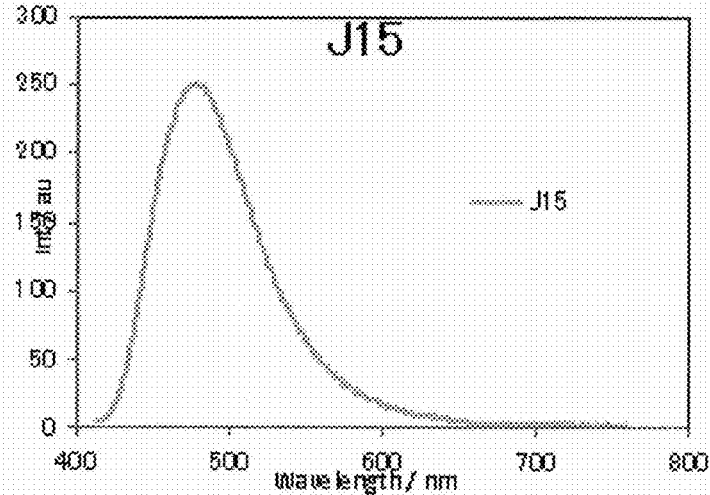
Figure 10A:
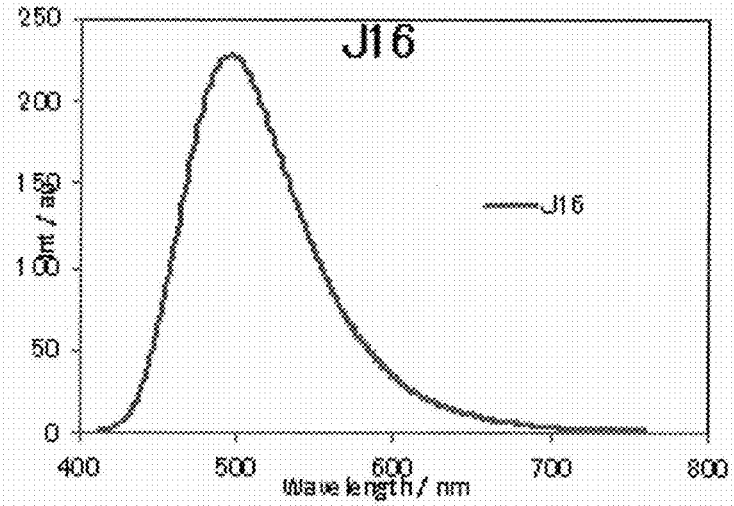
FIG. 10A and FIG. 10B show graphs showing light-emitting properties of phosphors obtained in Examples 16 and 17 of the present invention.
Figure 10B:
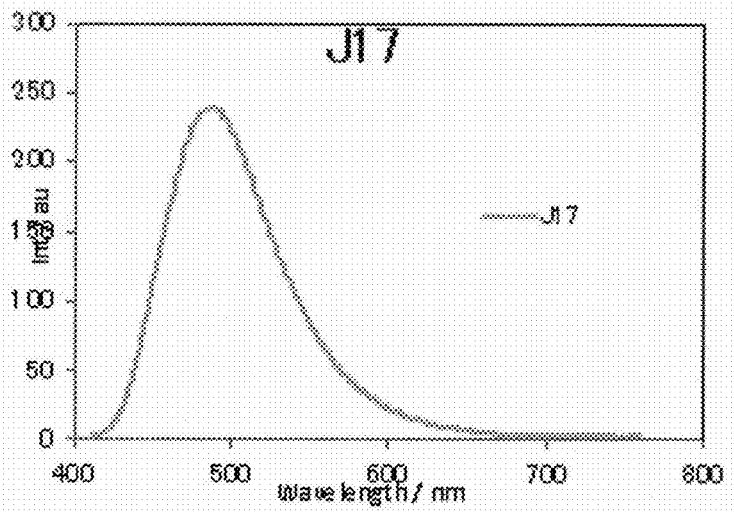

The compositions of the phosphors obtained in Examples 1 to 6 and Comparative Examples 1 to 7 are shown in the following table. The X-ray diffraction patterns of the phosphors obtained in Examples 1 to 6 and Comparative Examples 1 to 7 are shown in FIG. 1A to FIG. 4D. The light-emitting properties of the phosphors obtained in Examples 1 to 6 are shown in FIG. 5A and FIG. 6C (In the figures, J stands for Example; whereas, H stands for Comparative Example).

Example 7

Further, similarly to the above, starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.9:7.1:2.0:6:2, and then, the same procedure as in Example 1 was repeated to produce a blue-green light-emitting phosphor corresponding to $Eu_{0.9}Ba_{7.1}Sr_{2.0}(PO_4)_6Cl_2$ and the X-ray diffraction pattern and light-emitting properties of the phosphor were obtained.

Example 8

A phosphor was formed of a composition containing Ca. Starting materials, $Eu_2O_3$, $BaCO_3$, $SrCO_3$, $CaCO_3$, $BaHPO_4$, $SrHPO_4$, $BaCl_2$ and $SrCl_2$ were weighted such that the final molar ratio of Eu:Ba:Sr:Ca:P:Cl was 0.9:6.6:1.5:1.0:6:2, and then, the same procedure as in Example 1 was repeated to produce a blue-green light-emitting phosphor corresponding to $Eu_{0.9}Ba_{6.6}Sr_{1.5}Ca_{1.0}(PO_4)_6Cl_2$ and the X-ray diffraction pattern and light-emitting properties of the phosphor were obtained.

Example 9

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 1.0:5.7:3.3:6:2, and then, the same procedure as in Example 1 was repeated to produce a blue-green light-emitting phosphor corresponding to $Eu_{1.0}Ba_{5.7}Sr_{3.3}(P_4)_6Cl_2$ and the X-ray diffraction pattern and light-emitting properties of the phosphor were obtained.

Example 10

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 1.0:6.7:2.3:6:2, and then, the same procedure as in Example 1 was repeated to produce a blue-green light-emitting phosphor corresponding to $Eu_{1.0}Ba_{6.7}Sr_{2.3}(PO_4)_6Cl_2$ and the X-ray diffraction pattern and light-emitting properties of the phosphor were obtained.

Example 11

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 1.2:6.3:2.5:6:2, and then, the same procedure as in Example 1 was repeated to produce a blue-green light-emitting phosphor corresponding to $Eu_{1.0}Ba_{6.7}Sr_{2.3}(PO_4)_6Cl_2$ and the X-ray diffraction pattern and light-emitting properties of the phosphor were obtained.

TABLE 1

| Item | | Eu | Ca | Mg | Sr | Ba | Cl |
|---|---|---|---|---|---|---|---|
| Example1 | $Eu_{0.5}Ba_{8.0}Sr_{1.5}(PO_4)_6Cl_2$ | 0.5 | | | 1.5 | 8 | 2 |
| Example2 | $Eu_{0.5}Ba_{8.4}Sr_{1.1}(PO_4)_6Cl_2$ | 0.5 | | | 1.1 | 8.4 | 2 |
| Example3 | $Eu_{0.6}Ba_{7.7}Sr_{1.7}(PO_4)_6Cl_2$ | 0.6 | | | 1.7 | 7.7 | 2 |
| Example4 | $Eu_{0.6}Ba_{8.1}Sr_{1.3}(PO_4)_6Cl_2$ | 0.6 | | | 1.3 | 8.1 | 2 |
| Example5 | $Eu_{0.6}Ba_{6.5}Sr_{2.9}(PO_4)_6Cl_2$ | 0.6 | | | 2.9 | 6.5 | 2 |
| Example6 | $Eu_{0.6}Ba_{7.4}Sr_{2.0}(PO_4)_6Cl_2$ | 0.6 | | | 2 | 7.4 | 2 |
| Comparative Example1 | $Eu_{0.5}Sr_{9.5}(PO_4)_6Cl_2$ | 0.5 | | | 9.5 | | 2 |
| Comparative Example2 | $Eu_{0.5}Ba_{2.2}Sr_{7.3}(PO_4)_6Cl_2$ | 0.5 | | | 7.3 | 2.2 | 2 |
| Comparative Example3 | $Eu_{0.6}Ba_{3.5}Sr_{5.9}(PO_4)_6Cl_2$ | 0.6 | | | 5.9 | 3.5 | 2 |
| Comparative Example4 | $Eu_{0.6}Ba_{9.4}(PO_4)_6Cl_2$ | 0.6 | | | 0 | 9.4 | 2 |
| Comparative Example5 | $Eu_{0.5}Ba_{4.2}Sr_{5.3}(PO_4)_6Cl_2$ | 0.5 | | | 5.3 | 4.2 | 2 |
| Comparative Example6 | $Eu_{0.3}Ba_{5.0}Sr_{3.0}Ca_{1.5}Mg_{0.2}(PO_4)_6Cl_2$ | 0.3 | 1.5 | 0.2 | 3 | 5 | 2 |
| Comparative Example7 | $Eu_{0.3}Ba_{9.25}Sr_{0.45}(PO_4)_6Cl_2$ | 0.3 | | | 0.45 | 9.25 | 2 |

Example 12

A phosphor was formed of a composition containing Ca. Starting materials, $Eu_2O_3$, $BaCO_3$, $SrCO_3$, $CaCO_3$, $BaHPO_4$, $SrHPO_4$, $BaCl_2$ and $SrCl_2$ were weighted such that the final molar ratio of Eu:Ba:Sr:Ca:P:Cl was 1.0:6.7:2.1:0.2:6:2, and then, the same procedure as in Example 1 was repeated to produce a blue-green light-emitting phosphor corresponding to $Eu_{1.0}Ba_{6.7}Sr_{2.1}Ca_{0.2}(PO_4)_6Cl_2$ and the X-ray diffraction pattern and light-emitting properties of the phosphor were obtained.

Example 13

A phosphor was formed of a composition containing Ca and Mg. Starting materials, $Eu_2O_3$, $BaCO_3$, $SrCO_3$, $CaCO_3$, $Mg(OH)_2$, $BaHPO_4$, $SrHPO_4$, $BaCl_2$ and $SrCl_2$ were weighted such that the final molar ratio of Eu:Ba:Sr:Ca:Mg:P:Cl was 1.0:5.7:2.8:0.4:0.1:6:2, and then, the same procedure as in Example 1 was repeated to produce a blue-green light-emitting phosphor corresponding to $Eu_{1.0}Ba_{5.7}Sr_{2.8}Ca_{0.4}Mg_{0.1}(PO_4)_6Cl_2$ and the X-ray diffraction pattern and light-emitting properties of the phosphor were obtained.

Example 14

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 1.5:7.2:1.3:6:2, and then, the same procedure as in Example 1 was repeated to produce a blue-green light-emitting phosphor corresponding to $Eu_{1.5}Ba_{7.2}Sr_{1.3}(PO_4)_6Cl_2$ and the X-ray diffraction pattern and light-emitting properties of the phosphor were obtained.

Example 15

A phosphor was formed of a composition containing Mg. Starting materials, $Eu_2O_3$, $BaCO_3$, $SrCO_3$, $Mg(OH)_2$, $BaHPO_4$, $SrHPO_4$, $BaCl_2$ and $SrCl_2$ were weighted such that the final molar ratio of Eu:Ba:Sr:Mg:P:Cl was 0.5:7.2:1.8:0.5:6:2, and then, the same procedure as in Example 1 was repeated to produce a blue-green light-emitting phosphor corresponding to $Eu_{0.5}Ba_{7.2}Sr_{1.8}Mg_{0.5}(PO_4)_6Cl_2$ and the X-ray diffraction pattern and light-emitting properties of the phosphor were obtained.

Example 16

A phosphor was formed of a composition containing Ca. Starting materials, $Eu_2O_3$, $BaCO_3$, $SrCO_3$, $CaCO_3$, $BaHPO_4$, $SrHPO_4$, $BaCl_2$ and $SrCl_2$ were weighted such that the final molar ratio of Eu:Ba:Sr:Ca:P:Cl was 0.5:0.6:6.5:1.4:1.5:6:2 and then, the same procedure as in Example 1 was repeated to produce a blue-green light-emitting phosphor corresponding to $Eu_{0.5}Ba_{6.5}Sr_{1.4}Ca_{1.5}(PO_4)_6Cl_2$ and the X-ray diffraction pattern and light-emitting properties of the phosphor were obtained.

Example 17

A phosphor was formed of a composition containing Ca. Starting materials, $Eu_2O_3$, $BaCO_3$, $SrCO_3$, $CaCO_3$, $BaHPO_4$, $SrHPO_4$, $BaCl_2$ and $SrCl_2$ were weighted such that the final molar ratio of Eu:Ba:Sr:Ca:P:Cl was 0.6:6.5:2.4:0.5:6:2, and then, the same procedure as in Example 1 was repeated to produce a blue-green light-emitting phosphor corresponding to $Eu_{0.6}Ba_{6.5}Sr_{2.4}Ca_{0.5}(PO_4)_6Cl_2$ and the X-ray diffraction pattern and light-emitting properties of the phosphor were obtained.

Comparative Example 8

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.9:3.2:5.9:6:2, and then, the same procedure as in Example 1 was repeated to produce a blue-green light-emitting phosphor corresponding to $Eu_{0.9}Ba_{3.2}Sr_{5.9}(PO_4)_6Cl_2$ and the X-ray diffraction pattern and light-emitting properties of the phosphor were obtained.

Comparative Example 9

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 1.35:2.95:5.7:6:2, and then, the same procedure as in Example 1 was repeated to produce a blue-green light-emitting phosphor corresponding to $Eu_{1.35}Ba_{2.95}Sr_{5.7}(PO_4)_6Cl_2$ and the X-ray diffraction pattern and light-emitting properties of the phosphor were obtained.

Comparative Example 10

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 1.5:2.95:5.55:6:2, and then, the same procedure as in Example 1 was repeated to produce a blue-green light-emitting phosphor corresponding to $Eu_{1.5}Ba_{2.95}Sr_{5.55}(PO_4)_6Cl_2$ and the X-ray diffraction pattern and light-emitting properties of the phosphor were obtained.

Comparative Example 11

A phosphor was formed of a composition containing Ca. Starting materials, $Eu_2O_3$, $BaCO_3$, $SrCO_3$, $CaCO_3$, $BaHPO_4$, $SrHPO_4$, $BaCl_2$ and $SrCl_2$ were weighted such that the final molar ratio of Eu:Ba:Sr:Ca:P:Cl was 0.6:3.4:4.5:1.5:6:2, and then, the same procedure as in Example 1 was repeated to produce a blue-green light-emitting phosphor corresponding to $Eu_{0.6}Ba_{3.4}Sr_{4.5}Ca_{1.5}(PO_4)_6Cl_2$ and the X-ray diffraction pattern and light-emitting properties of the phosphor were obtained.

Comparative Example 12

A phosphor was formed of a composition containing Ca. Starting materials, $Eu_2O_3$, $BaCO_3$, $SrCO_3$, $CaCO_3$, $BaHPO_4$, $SrHPO_4$, $BaCl_2$ and $SrCl_2$ were weighted such that the final molar ratio of Eu:Ba:Sr:Ca:P:Cl was 0.6:3.4:5.5:0.5:6:2, and then, the same procedure as in Example 1 was repeated to produce a blue-green light-emitting phosphor corresponding to $Eu_{0.6}Ba_{3.4}Sr_{5.5}Ca_{0.5}(PO_4)_6Cl_2$ and the X-ray diffraction pattern and light-emitting properties of the phosphor were obtained.

Comparative Example 13

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.9:3.7:5.4:6:2, and then, the same procedure as in Example 1 was repeated to produce a blue-green light-emitting phosphor corresponding to $Eu_{0.9}Ba_{3.7}Sr_{5.4}(PO_4)_6Cl_2$ and the X-ray diffraction pattern and light-emitting properties of the phosphor were obtained.

Comparative Example 14

Starting materials, $Eu_2O_3$, $BaCO_3$, $SrCO_3$, $BaHPO_4$, $SrHPO_4$, $BaCl_2$ and $SrCl_2$ were weighted such that the final molar ratio of Eu:Ba:Sr:P:Cl was 0.8:5.0:4.2:6:2, and then, the same procedure as in Example 1 was repeated to produce a blue-green light-emitting phosphor corresponding to $Eu_{0.8}Ba_{5.0}Sr_{4.2}(PO_4)_6Cl_2$ and the X-ray diffraction pattern and light-emitting properties of the phosphor were obtained.

The compositions of the phosphors obtained in Examples 7 to 17 and Comparative Examples 8 to 14 are shown in the following table. The light-emitting properties of the phosphors obtained in Examples 7 to 17 are shown in FIG. 7A to FIG. 10B (In the figures, J stands for Example; whereas, H stands for Comparative Example).

TABLE 2

| Item | | Eu | Ca | Mg | Sr | Ba | Cl |
|---|---|---|---|---|---|---|---|
| Example7 | $Eu_{0.9}Ba_{7.1}Sr_{2.0}(PO_4)_6Cl_2$ | 0.9 | | | 2 | 7.1 | 2 |
| Example8 | $Eu_{0.9}Ba_{6.6}Sr_{1.5}Ca_{1.0}(PO_4)_6Cl_2$ | 0.9 | 1 | | 1.5 | 6.6 | 2 |
| Example9 | $Eu_{1.0}Ba_{5.7}Sr_{3.3}(PO_4)_6Cl_2$ | 1 | | | 3.3 | 5.7 | 2 |
| Example10 | $Eu_{1.0}Ba_{6.7}Sr_{2.3}(PO_4)_6Cl_2$ | 1 | | | 2.3 | 6.7 | 2 |
| Example11 | $Eu_{1.2}Ba_{6.3}Sr_{2.5}(PO_4)_6Cl_2$ | 1.2 | | | 2.5 | 6.3 | 2 |
| Example12 | $Eu_{1.0}Ba_{6.7}Sr_{2.1}Ca_{0.2}(PO_4)_6Cl_2$ | 1 | 0.2 | | 2.1 | 6.7 | 2 |
| Example13 | $Eu_{1.0}Ba_{5.7}Sr_{2.8}Ca_{0.4}Mg_{0.1}(PO_4)_6Cl_2$ | 1 | 0.4 | 0.1 | 2.8 | 5.7 | 2 |
| Example14 | $Eu_{1.5}Ba_{7.2}Sr_{1.3}(PO_4)_6Cl_2$ | 1.5 | | | 1.3 | 7.2 | 2 |
| Example15 | $Eu_{0.5}Ba_{7.2}Sr_{1.8}Mg_{0.5}(PO_4)_6Cl_2$ | 0.5 | | 0.5 | 1.8 | 7.2 | 2 |
| Example16 | $Eu_{0.6}Ba_{6.5}Sr_{1.4}Ca_{1.5}(PO_4)_6Cl_2$ | 0.6 | 1.5 | | 1.4 | 6.5 | 2 |
| Example17 | $Eu_{0.6}Ba_{6.5}Sr_{2.4}Ca_{0.5}(PO_4)_6Cl_2$ | 0.6 | 0.5 | | 2.4 | 6.5 | 2 |
| Comparative Example8 | $Eu_{0.9}Ba_{3.2}Sr_{5.9}(PO_4)_6Cl_2$ | 0.9 | | | 5.9 | 3.2 | 2 |
| Comparative Example9 | $Eu_{1.35}Ba_{2.95}Sr_{5.7}(PO_4)_6Cl_2$ | 1.35 | | | 5.7 | 2.95 | 2 |
| Comparative Example10 | $Eu_{1.5}Ba_{2.95}Sr_{5.55}(PO_4)_6Cl_2$ | 1.5 | | | 5.55 | 2.95 | 2 |
| Comparative Example11 | $Eu_{0.6}Ba_{3.4}Sr_{4.5}Ca_{1.5}(PO_4)_6Cl_2$ | 0.6 | 1.5 | | 4.5 | 3.4 | 2 |
| Comparative Example12 | $Eu_{0.6}Ba_{3.4}Sr_{5.5}Ca_{0.5}(PO_4)_6Cl_2$ | 0.6 | 0.5 | | 5.5 | 3.4 | 2 |
| Comparative Example13 | $Eu_{0.9}Ba_{3.7}Sr_{5.4}(PO_4)_6Cl_2$ | 0.9 | | | 5.4 | 3.7 | 2 |
| Comparative Example14 | $Eu_{0.8}Ba_{5.0}Sr_{4.2}(PO_4)_6Cl_2$ | 0.8 | | | 5 | 4.2 | 2 |

If the case where a phosphor is used in lighting where high power and high-level continuous operation are required is presumed, emission performance at 150° C. becomes important. Thus, the phosphors obtained in Examples 1 to 6 and Comparative Examples 1 to 7 were subjected to measurement of brightness, light-emitting area, maintenance rate, light-emitting area at 150° C. and brightness at 150° C. The results are shown in the following table, together with the molar ratio [Ba] of a barium element to the all alkaline earth metal elements (More specifically, molar ratio (Ba)/molar ratio (Sr+Ca+Mg)) in each of the phosphors.

TABLE 3

| | Eu | Ca | Mg | Sr | Ba | [Ba] | Brightness Y % | x | y | Light-emitting area A % | Maintenance rate A 150° C. | Maintenance rate Y 150° C. | Light-emitting area at 150° C. A150 | Brightness at 150° C. Y150 | XRD |
|---|---|---|---|---|---|---|---|---|---|---|---|---|---|---|---|
| Example1 | 0.5 | | | 1.5 | 8 | 0.84 | 567 | 0.15 | 0.19 | 130 | 92 | 94 | 119 | 533 | Ba phase |
| Example2 | 0.5 | | | 1.1 | 8.4 | 0.88 | 529 | 0.15 | 0.19 | 123 | 90 | 93 | 111 | 492 | Ba phase |
| Example3 | 0.6 | | | 1.7 | 7.7 | 0.82 | 622 | 0.15 | 0.23 | 128 | 93 | 89 | 119 | 555 | Ba phase |
| Example4 | 0.6 | | | 1.3 | 8.1 | 0.86 | 583 | 0.15 | 0.2 | 131 | 90 | 90 | 118 | 527 | Ba phase |
| Example5 | 0.6 | | | 2.9 | 6.5 | 0.69 | 676 | 0.16 | 0.25 | 129 | 92 | 90 | 119 | 608 | Ba phase |
| Example6 | 0.6 | | | 2 | 7.4 | 0.79 | 667 | 0.15 | 0.25 | 130 | 93 | 92 | 121 | 611 | Ba phase |
| Comparative Example1 | 0.5 | | | 9.5 | | 0.00 | 100 | 0.15 | 0.03 | 100 | 88 | 91 | 88 | 91 | Sr phase |
| Comparative Example2 | 0.5 | | | 7.3 | 2.2 | 0.23 | 449 | 0.15 | 0.15 | 115 | — | — | | | Sr phase |
| Comparative Example3 | 0.6 | | | 5.9 | 3.5 | 0.37 | 530 | 0.15 | 0.19 | 116 | 88 | 88 | 103 | 469 | Sr phase |
| Comparative Example4 | 0.6 | | | 0 | 9.4 | 1.00 | 174 | 0.15 | 0.09 | 63 | — | | | | Ba phase |

TABLE 3-continued

|  | Eu | Ca | Mg | Sr | Ba | [Ba] | Brightness Y % | x | y | Light-emitting area A % | Maintenance rate A 150° C. | Maintenance rate Y 150° C. | Light-emitting area at 150° C. A150 | Brightness at 150° C. Y150 | XRD |
|---|---|---|---|---|---|---|---|---|---|---|---|---|---|---|---|
| Comparative Example5 | 0.5 |  |  | 5.3 | 4.2 | 0.44 | 603 | 0.16 | 0.26 | 108 | 92 | 92 | 99 | 552 | Ba + Sr |
| Comparative Example6 | 0.3 | 1.5 | 0.2 | 3 | 5 | 0.52 | 783 | 0.19 | 0.35 | 116 | — |  |  |  | Ba phase |
| Comparative Example7 | 0.3 |  |  | 0.5 | 9.3 | 0.95 | 205 | 0.15 | 0.1 | 64 | — |  |  |  | Ba phase |

Similarly to the above, the phosphors obtained in Examples 7 to 17 and Comparative Examples 8 to 14 were subjected to measurement of brightness, light-emitting area, maintenance rate, light-emitting area at 150° C. and brightness at 150° C.

The results are shown in the following table.

TABLE 4

|  | Eu | Ca | Mg | Sr | Ba | [Ba] | Brightness Y % | x | y | Area % A % | Maintenance rate A 150° C. | Maintenance rate Y 150° C. | A150 | Y150 |
|---|---|---|---|---|---|---|---|---|---|---|---|---|---|---|
| Example7 | 0.9 |  |  | 2 | 7.1 | 0.78 | 718 | 0.156 | 0.259 | 135 | 88 | 86 | 119 | 618 |
| Example8 | 0.9 | 1 |  | 1.5 | 6.6 | 0.73 | 929 | 0.198 | 0.394 | 135 | 87 | 90 | 117 | 838 |
| Example9 | 1 |  |  | 3.3 | 5.7 | 0.63 | 788 | 0.161 | 0.292 | 127 | — |  |  |  |
| Example10 | 1 |  |  | 2.3 | 6.7 | 0.74 | 766 | 0.158 | 0.276 | 137 | 89 | 85 | 121 | 652 |
| Example11 | 1.2 |  |  | 2.5 | 6.3 | 0.72 | 766 | 0.164 | 0.306 | 128 | 87 | 84 | 112 | 642 |
| Example12 | 1 | 0.2 |  | 2.1 | 6.7 | 0.74 | 783 | 0.163 | 0.293 | 135 | — |  |  |  |
| Example13 | 1 | 0.4 | 0.1 | 2.8 | 5.7 | 0.63 | 904 | 0.177 | 0.35 | 138 | — |  |  |  |
| Example14 | 1.5 |  |  | 1.3 | 7.2 | 0.85 | 705 | 0.157 | 0.277 | 127 | 84 | 80 | 106 | 566 |
| Example15 | 0.5 |  | 0.5 | 1.8 | 7.2 | 0.76 | 671 | 0.16 | 0.255 | 124 | — |  |  |  |
| Example16 | 0.6 | 1.5 |  | 1.4 | 6.5 | 0.69 | 936 | 0.203 | 0.401 | 128 | 93 | 89 | 118 | 835 |
| Example17 | 0.6 | 0.5 |  | 2.4 | 6.5 | 0.69 | 799 | 0.173 | 0.322 | 126 | 91 | 88 | 114 | 702 |
| Comparative Example8 | 0.9 |  |  | 5.9 | 3.2 | 0.35 | 673 | 0.155 | 0.238 | 135 | 85 | 82 | 114 | 549 |
| Comparative Example9 | 1.35 |  |  | 5.7 | 2.95 | 0.34 | 686 | 0.158 | 0.261 | 129 | 83 | 81 | 108 | 558 |
| Comparative Example10 | 1.5 |  |  | 5.55 | 2.95 | 0.35 | 673 | 0.159 | 0.269 | 124 | 81 | 77 | 101 | 516 |
| Comparative Example11 | 0.6 | 1.5 |  | 4.5 | 3.4 | 0.36 | 821 | 0.179 | 0.332 | 127 | 86 | 88 | 110 | 720 |
| Comparative Example12 | 0.6 | 0.5 |  | 5.5 | 3.4 | 0.36 | 821 | 0.159 | 0.257 | 125 | 85 | 86 | 106 | 706 |
| Comparative Example13 | 0.9 |  |  | 5.4 | 3.7 | 0.41 | 622 | 0.157 | 0.26 | 126 | — |  |  |  |
| Comparative Example14 | 0.8 |  |  | 5 | 4.2 | 0.46 | 676 | 0.157 | 0.252 | 124 | — |  |  |  |

(Dependency of Light-Emitting Area on Barium Concentration)

Figure 11:
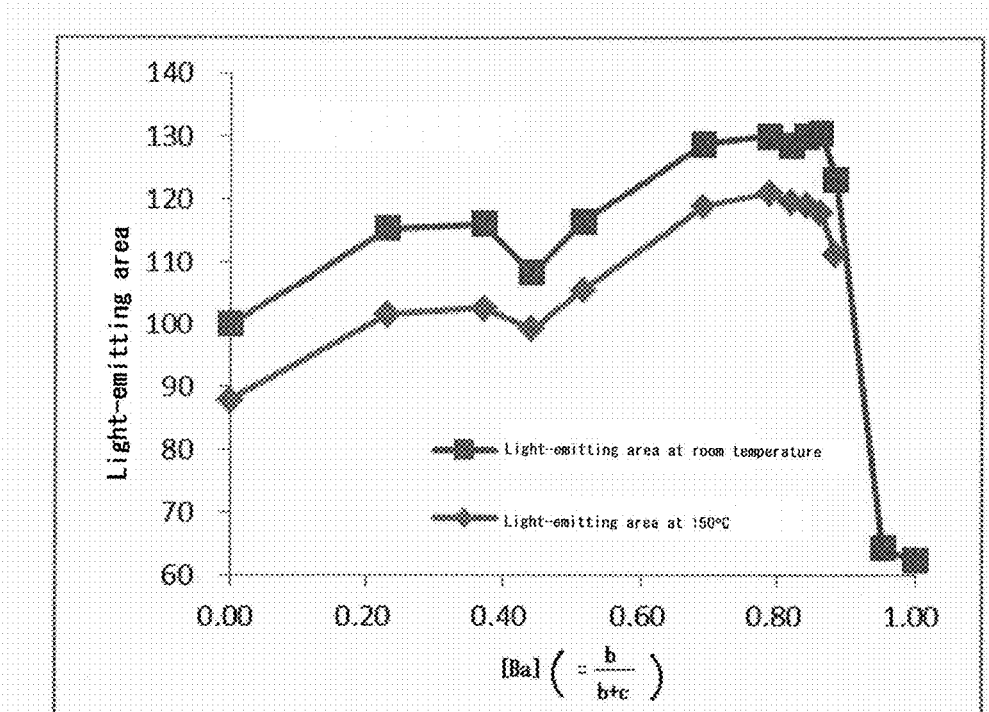
FIG. 11 is a graph showing the barium concentration dependency of the light-emitting area of a phosphor of Example of present invention.

The dependency of the light-emitting areas of the phosphors obtained in Examples mentioned above on barium concentration is shown in the graph of FIG. 11. From the results, it was confirmed that in the range where the molar ratio [Ba] of a barium element to the all alkaline earth metal elements (i.e., molar ratio (Ba)/molar ratio (Sr+Ca+Mg)) is larger than 0.6, i.e., [Ba]>0.6, the light-emitting area stably increased with an increase of [Ba]; however, in the range of [Ba]≥0.95, the light-emitting area sharply decreased. In the range where [Ba] of the composition is larger than 0.6 and smaller than 0.95, a decrease of the light-emitting area at 150° C. by heat is low. From this, it was confirmed that the phosphors are excellent in heat resistance.

(Correlation Between the Molar Ratio of Barium Element and Crystal Structure Observed in X-Ray Diffraction Pattern)

Figure 12:
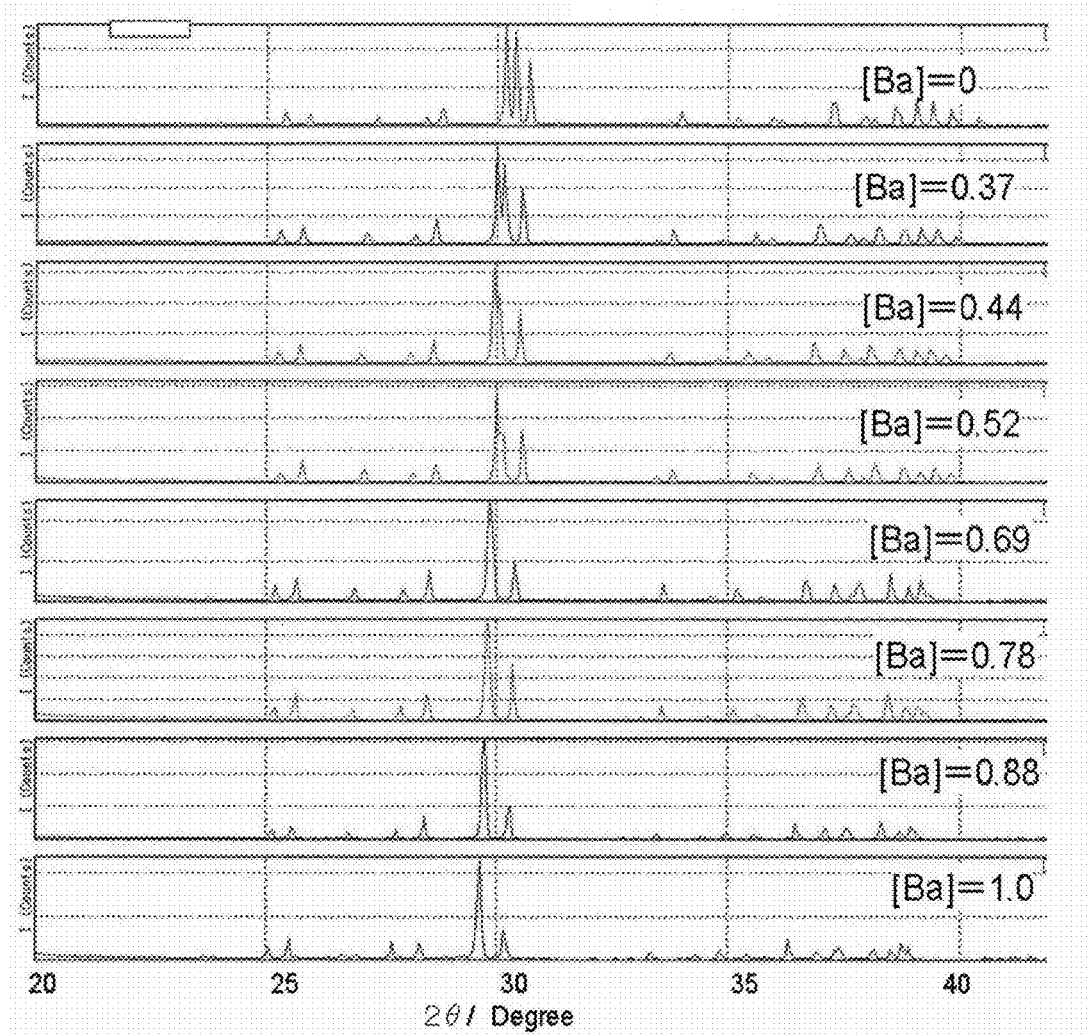
FIG. 12 shows X-ray diffraction patterns showing the correlation between the molar ratio of a barium element to the all alkaline earth metal elements and crystal structure, with respect to the phosphors obtained in Examples and Comparative Examples of the present invention.

With respect to the phosphors obtained in Examples and Comparative Examples mentioned above, X-ray diffraction patterns of the phosphors different in the molar ratio of a barium element to the all alkaline earth metal elements, are shown in FIG. 12. From the results, it was confirmed that, in the cases where a molar ratio [Ba] (of a barium element to the all alkaline earth metal elements) is 60% or less, crystal phases (SCA phase: a crystal structure mainly constituted of Sr) having three diffraction peaks derived from the (211) plane, (112) plane and (300) plane were observed at a 2θ value of about 30θ in the X-ray diffraction patterns; whereas, if [Ba] is larger than 60%, crystal phases (BCA phase: a crystal structure mainly constituted of Ba) having two diffraction peaks derived from the (112) plane and (300) plane were observed.

(Correlation Between the Mixing Ratio of Europium and Light-Emitting Area)

Figure 13:
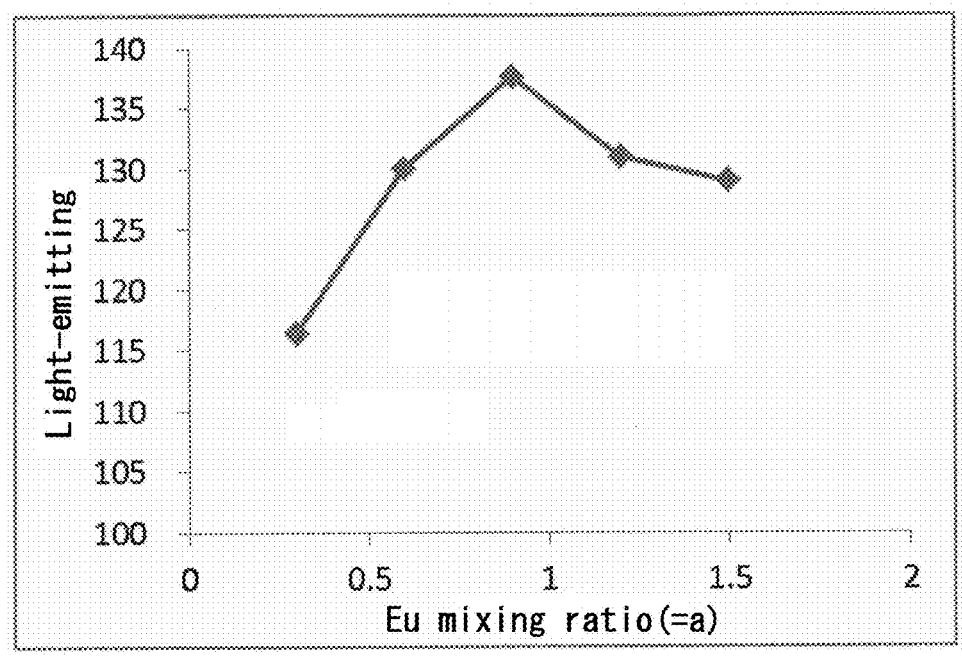
FIG. 13 is a graph showing the correlation between the Eu concentration and the light-emitting area, with respect to phosphors obtained in Examples and Comparative Examples of the present invention.

Correlation of the Eu mixing ratio and the light-emitting area, which was observed in the phosphors obtained in Examples and Comparative Examples mentioned above, is shown in FIG. 13. From the results, it was confirmed that if the Eu mixing ratio is lower than 0.3, initial property was low. In contrast, if the Eu mixing ratio is higher than 1.5, temperature property was poor. From this, it was confirmed that, in order to obtain further excellent light-emitting properties, the Eu mixing ratio is preferably 0.3 to 1.5 and more preferably, 0.5 to 1.5.

(Correlation Between Europium Mixing Ratio and Temperature Property)

Figure 14A:
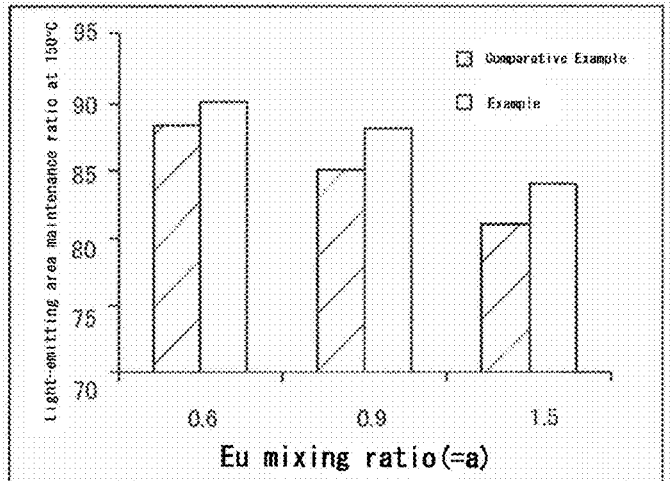
FIG. 14A to FIG. 14 C show graphs showing the correlation between the Eu mixing ratio and temperature property, with respect to phosphors obtained in Examples 4, 7 and 14 and Comparative Examples 3, 8 and 10.
Figure 14B:
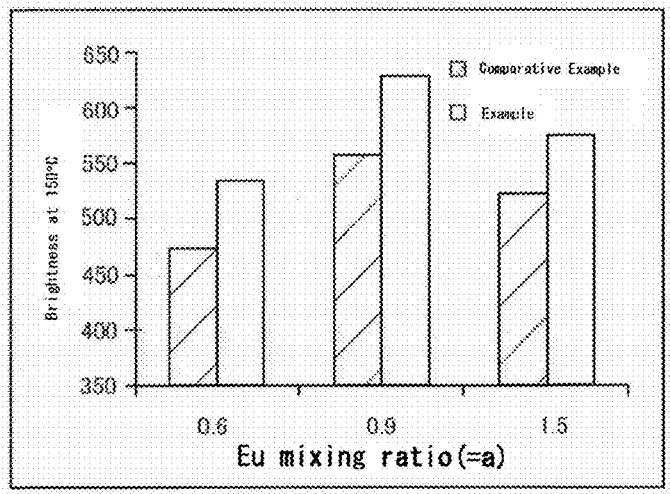
Figure 14C:
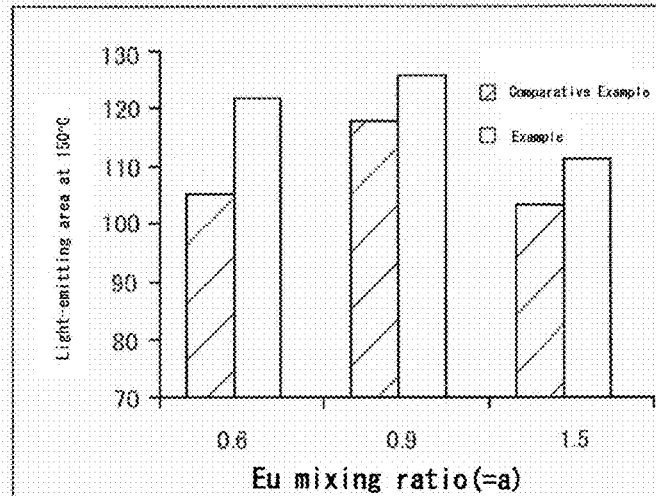

Correlation of the Eu mixing ratio and temperature property (light-emitting area maintenance rate at 150° C.), which was observed in the phosphors obtained in Examples 4, 7 and 14 and Comparative Examples 3, 8, and 10, is shown in the following table and FIG. 14A to FIG. 14C.

TABLE 5

| Eu | No | Temperature property | [Ba] | No | Temperature property | [Ba] |
|---|---|---|---|---|---|---|
| 0.6 | Comparative Example3 | 88 | 0.37 | Example4 | 90 | 0.86 |
| 0.0 | Comparative Example8 | 85 | 0.35 | Example7 | 88 | 0.78 |
| 1.5 | Comparative Example10 | 81 | 0.35 | Example14 | 84 | 0.85 |

From the results, it was confirmed that if the molar ratio [Ba] of a barium element to the all alkaline earth metal elements is high, satisfactory temperature property is obtained, regardless of the mixing ratio of europium. Likewise, if [Ba] is high, particularly in the case where the europium mixing ratio is high, high light-emitting area and brightness (property) are obtained. Even in this case, high maintenance rate is obtained. Thus, it is considered that a phosphor having excellent light-emitting properties in practice can be obtained.

(Tuning and Broadening Emission)

Figure 15A:
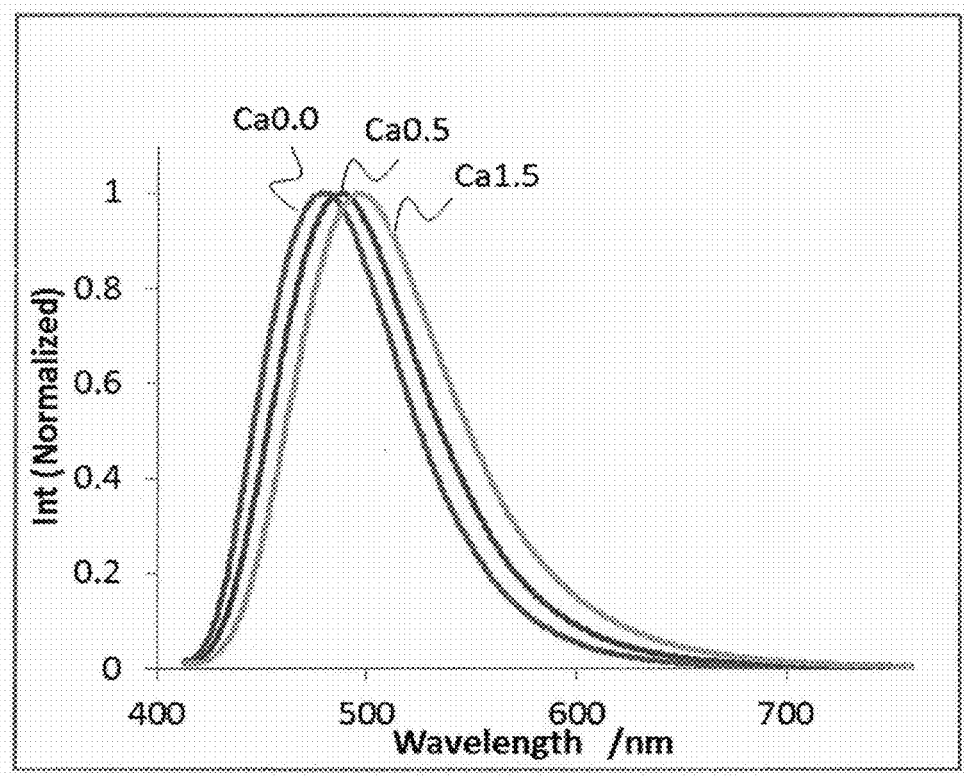
FIG. 15A and FIG. 15B show the graph (a) showing the correlation between the Ca mixing ratio and emission wavelength, observed in blue-green light-emitting phosphors obtained in Examples 5, 16 and 17 of the present invention, and a graph (b) showing the correlation between the Ca mixing ratio and the temperature property, with respect to phosphors obtained in Examples 5, 16 and 17 and Comparative Examples 3, 11 and 12 of the present invention.
Figure 15B:
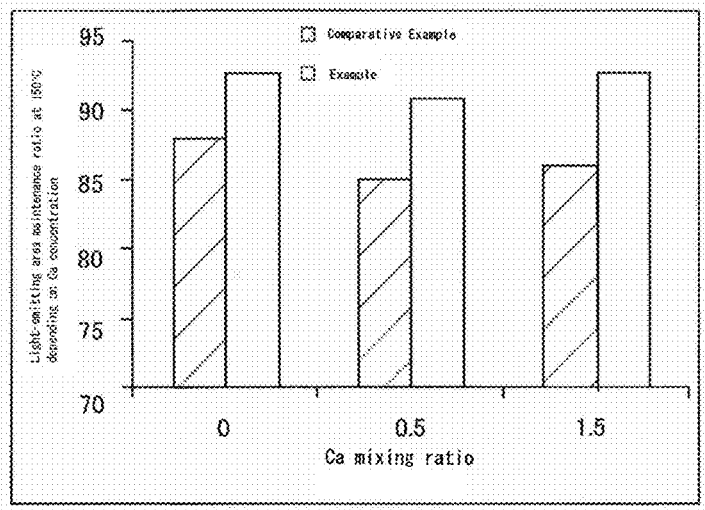

Correlation of the mixing ratios of Ca and Mg and temperature property, which was observed in the phosphors obtained in Examples 5, 16, and 17 and Comparative Examples 3, 11, and 12, is shown in the following table. Furthermore, the correlation of the mixing ratio of Ca and emission wavelength, which was observed in the blue-green light-emitting phosphors obtained in Examples 5, 16, and 17, is shown in FIG. 15A. Moreover, the correlation of the mixing ratio of Ca and temperature property (light-emitting area maintenance rate at 150° C.), which was observed in the blue-green light-emitting phosphors obtained in Examples 5, 16, and 17 and Comparative Examples 3, 11, and 12, is shown in FIG. 15B, together with the results of half width (FWMH).

TABLE 6

| Ca | No | Temperature property | [Ba] | No | Temperature property | [Ba] | FWMH/nm |
|---|---|---|---|---|---|---|---|
| 0 | Comparative Example3 | 88 | 0.37 | Example5 | 93 | 0.69 | 75 |
| 0.5 | Comparative Example12 | 85 | 0.36 | Example17 | 91 | 0.69 | 83 |
| 1.5 | Comparative Example11 | 86 | 0.36 | Example16 | 93 | 0.69 | 88 |

As is apparent from the results, in the blue-green light-emitting phosphors obtained in Examples, excellent (property of) half width (FWMH) was obtained by adding Ca and Mg. From this, it was confirmed that a light-emitting region can be more broadened. In conventional phosphors, temperature property deteriorates by adding Ca. However, in the blue-green light-emitting phosphors according to Examples of the present invention, even if Ca is contained, a light-emitting region can be more broadened while maintaining temperature property. It was confirmed that the phosphors of the invention have such an excellent property.

(Tabularization of Light-Emitting Area)

Figure 16:
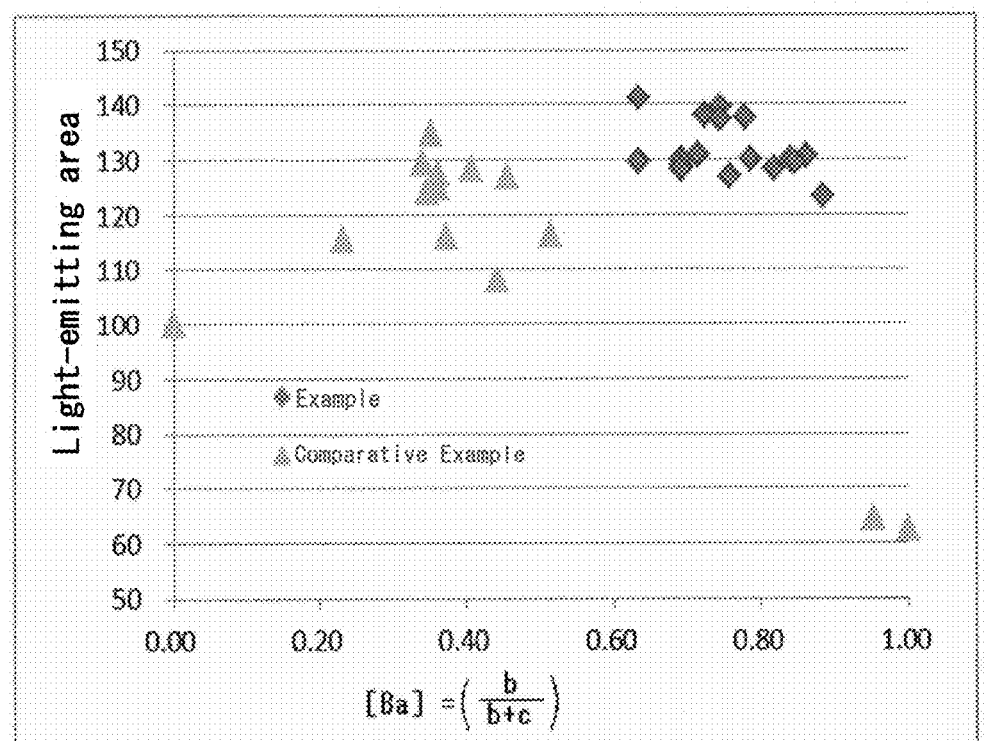
FIG. 16 is a graph showing light-emitting areas of the blue-green light-emitting phosphors obtained in Examples 1 to 17 of the present invention.

The light-emitting areas of the blue-green light-emitting phosphors obtained in Examples 1 to 17 are shown in FIG. 16. In consideration that the phosphors of the invention have higher temperature property than those of Comparative Examples, the light-emitting areas as effective values will be higher by about 10% than the numerical values shown in FIG. 16. Such excellent light-emitting properties were confirmed.

(Chromaticity Range of Blue-Green Light)

Figure 17A:
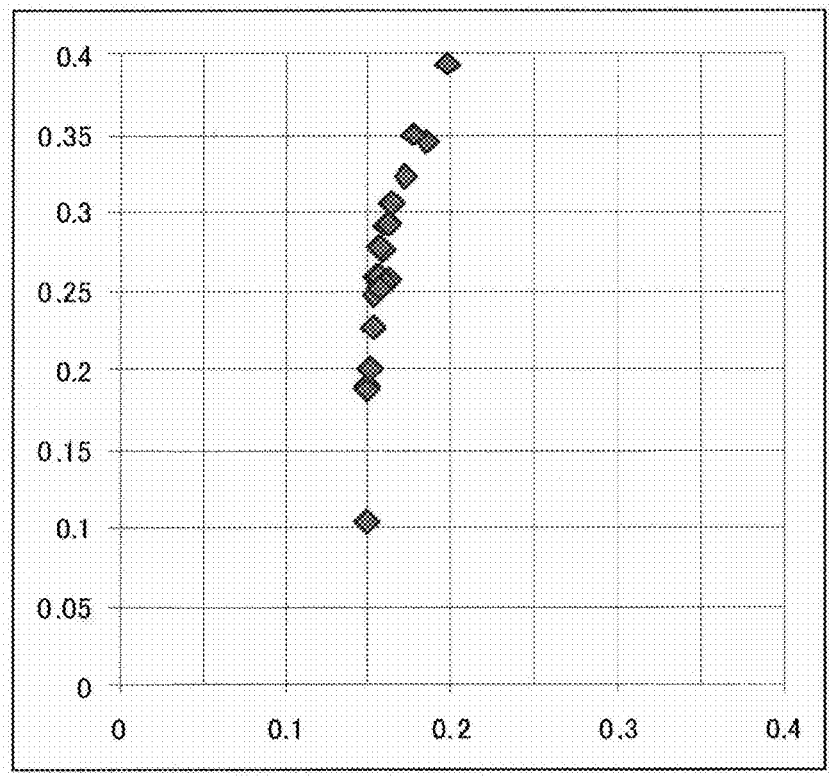
FIG. 17A and FIG. 17B show graphs showing chromaticity ranges of the blue-green light-emitting phosphors obtained in Examples 1 to 17 of the present invention.
Figure 17B:
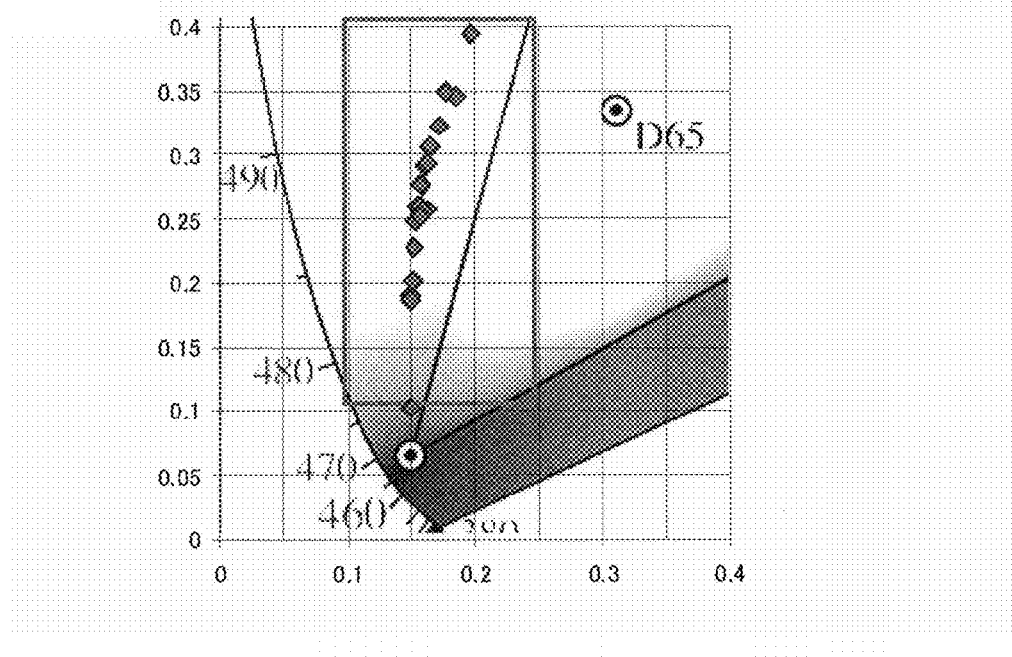

Chromaticity ranges of the blue-green light-emitting phosphors obtained in Examples 1 to 17 are shown in FIG. 17A and FIG. 17B. The chromaticity range obtained in FIG. 17A is expressed based on the chromaticity range CIE1931 color system and shown in FIG. 17B. From the results, it was confirmed that the following excellent property was obtained: in the chromaticity range CIE1931 color system of blue-green light-emitting phosphors for obtaining spectra close to that of sun light, a rectangle chromaticity region, which is defined by a chromaticity value x=0.10 to 0.25 and chromaticity value y=0.05 to 0.40, is formed. To explain more specifically, a blue-green light-emitting phosphor can be constituted containing 10 to 90 wt % of a blue-green light-emitting phosphor according to Example and at least one phosphor selected from the group of blue phosphors and green phosphors consisting of $BaMgAl_{10}O_{17}$:Eu, $(Ba,Sr)_3MgSi_3O_8$:Eu, $Sr_{10}(PO_4)_6Cl_2$:Eu, $Sr_2P_2O_7$:Eu, $Ca_2PO_4Cl$:Eu, $Ba_2PO_4Cl$:Eu, $(Ba,Sr)_2SiO_4$:Eu and $(Ba,Sr,Ca)Al_2O_4$:Eu.

(Use of Simulated Solar Lighting)

Figure 18:
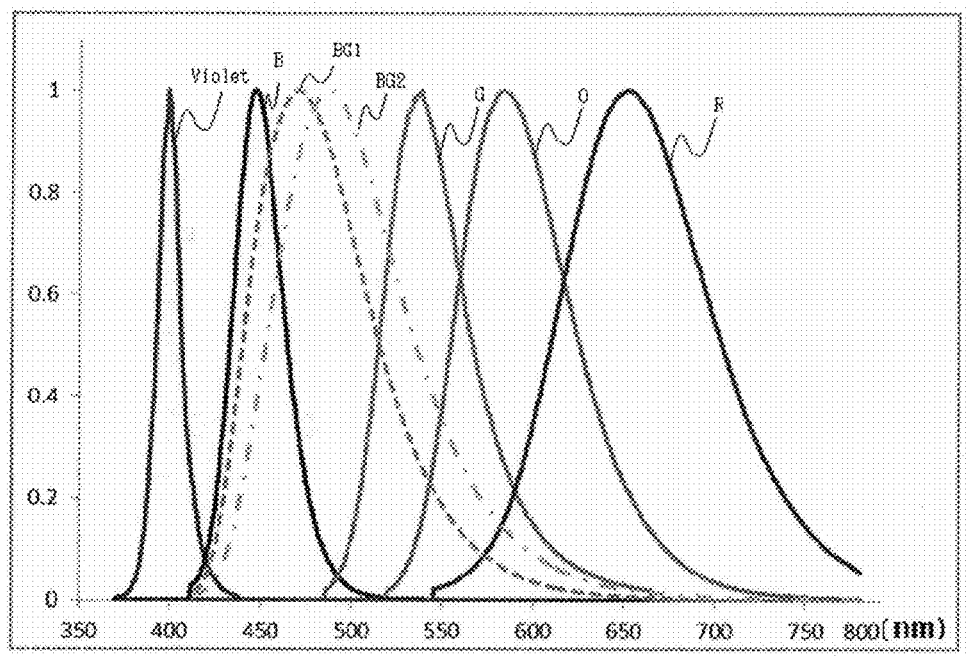
FIG. 18 shows emission spectra of light from the illuminating devices constituted of (one of) blue-green light-emitting phosphors obtained in Examples 4 and 17 of the present invention and other phosphors in combination.

To check use of simulated solar lighting, illuminating devices were constituted of the blue-green light-emitting phosphors obtained in Examples 4 and 17 and other phosphors in combination. The emission spectra thereof are shown in FIG. 18 (in the figure, BG1: Example 4, BG2: Example 17). As other phosphors, phosphors known in the art may be used. Examples of a red phosphor include, $(Ba,Sr,Ca)_3SiO_5$:Eu (for Example, $Sr_3SiO_5$:Eu (SSE)), (Ba, $Sr,Ca)_2(Si,Al)_5N_8$:Eu, $(Ca,Sr)AlSi(O,N)_3$ (for Example, (Sr, Ca) $AlN_3$:Eu (SCASN)), and $K_2(Si,Ge,Ti)F_6$:$Mn^{4+}$ (KSF), $Li(Eu,RE)W_2O_8$ (where RE includes at least one of Sc, Y, La, Gd and Lu) (LEW). Examples of a green phosphor include $(Ba,Sr,Ca,Mg)_2SiO_4$:Eu (BOSE), $Si_{6-z}Al_zO_zN_{8-z}$ (commonly called β-SiAlON), $(Ba,Sr)Si_2O_2N_2$, $(Ba, Sr, Ca) MgAl_{10}O_{17}$:$Eu^{2+}$, $Mn^{2+}$ (BAMN) and $(Ca,Sr)_8Mg(SiO_4)_4Cl_2$:Eu. Examples of a blue phosphor include $BaMgAl_{10}O_{17}$:Eu, $(Ba, Sr)_3MgSi_3O_8$:Eu, $Sr_{10}(PO_4)_6Cl_2$:Eu, $Sr_2P_2O_7$: Eu, $Ca_2PO_4Cl$:Eu and $Ba_2PO_4Cl$:Eu.

From the results, it was confirmed that a valley between blue and green in the emission spectrum is filled with the emission of a blue-green light-emitting phosphor of Example, with the result that simulated solar lighting (white-light-emitting device) having a spectrum close to that of sun light can be obtained. In the white-light-emitting device as mentioned above, the wavelength band and wavelength intensity of the blue-green light-emitting phosphor according to Example can be controlled by controlling the mixing ratio of the blue-green light-emitting phosphors or emission color thereof; with the result that the color temperature of the white light to be obtained can be freely controlled. Owing to the control, for example, white light with a bluish tone close to fluorescent color to white light with an orangish tone close to the color of a light bulb (even if these fall within the same white light but differ in tone) can be selectively obtained.

(Use of High Color-Rendering White-Light-Emitting Device)

Use of high color-rendering white-light-emitting devices employing the blue-green light-emitting phosphors according to Examples was checked. As such a white-light-emitting device, a device was constituted of a blue-green light-emitting phosphor (blue-green light-emitting phosphors (BCA) (J1, J12) according to Examples 1, 12 and a blue light-emitting phosphor (H1) according to Comparative Example 1) emitting blue to blue-green light of 430 to 500 nm, β SiAlON (or BOSE) emitting green to yellow light of 500 to 580 nm, SCASN emitting red to deep red light of 580 to 700 nm, and an LED element emitting near-ultraviolet light of 350 to 430 nm.

Figure 19:
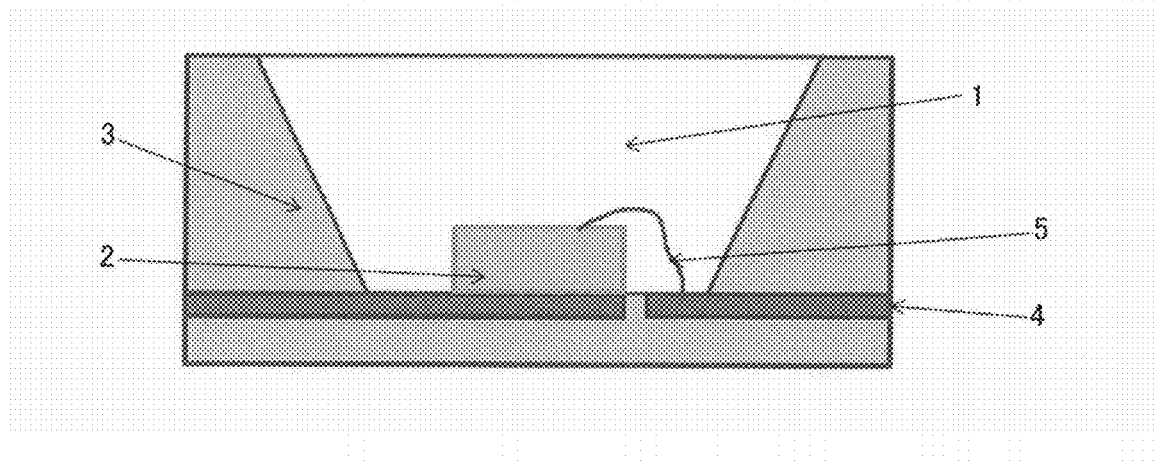
FIG. 19 is a view showing a structure of a white-light-emitting device using a blue-green light-emitting phosphor of the present invention.

The white-light-emitting device, as shown in FIG. 19, is constituted of a phosphor resin mixture 1 formed by mixing the phosphors mentioned above, a chip 2, a reflector 3, a lead frame 4 and a bonding wire 5. As the phosphor resin mixture 1, the following three types of phosphor resin mixture A, B, C were prepared. Three types of white-light-emitting devices were respectively formed from these phosphor resin mixtures.

(1) For Phosphor Resin Mixture A: Purple LED+(BCA (J12)+(H1))+β-SiAlON+SCASN

As an LED chip, a commercially available chip (400 nm) was used and embedded in a commercially available silicon resin consisting of (BCA (J12): (H1)): β-SiAlON: SCASN= (50:50): 12:20 to obtain a white-light-emitting device (white LED light-emitting device) having a structure shown in FIG. 19. Current was applied to the white-light-emitting device and the emission spectrum and color-rendering property were evaluated.

(2) For Phosphor Resin Mixture B: Purple LED+(BCA (J1))+BOSE+SCASN

As an LED chip, a commercially available chip (400 nm) was used and embedded in a commercially available silicon resin consisting of BCA (J1):BOSE:SCASN=100:12:18 to obtain a white-light-emitting device (white LED light-emitting device) having a structure shown in FIG. 19. Current was applied to the white-light-emitting device obtained and the emission spectrum and color-rendering property were evaluated.

(3) For Phosphor Resin Mixture C: Purple LED+BCA (J18)+β-SiAlON+SCASN

A white-light-emitting device was prepared by using a blue-green light-emitting phosphor except the blue-green light-emitting phosphor (BCA) (J1, J12) according to Example. First, a blue-green light-emitting phosphor, $Eu_{0.6}Ba_{7.9}Sr_{1.45}Mg_{0.05}(PO_4)_6Cl_2$ (defined as phosphor J18) to be used in the white-light-emitting device was synthesized in the same manner as in Examples.

(Production of Blue-Green Light-Emitting Phosphor $Eu_{0.6}Ba_{7.9}Sr_{1.45}Mg_{0.05}(PO_4)_6Cl_2$ (Phosphor J18))

Figure 20A:
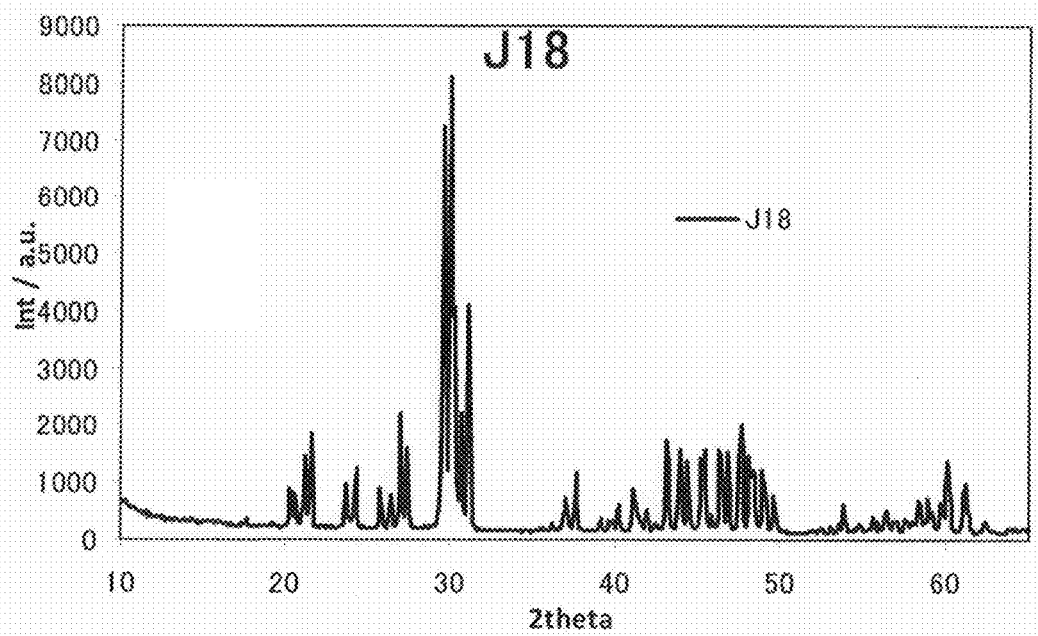
FIG. 20A and FIG. 20B show X-ray diffraction pattern (a) and light-emitting properties (b) of the phosphor (J18) of the present invention.
Figure 20B:
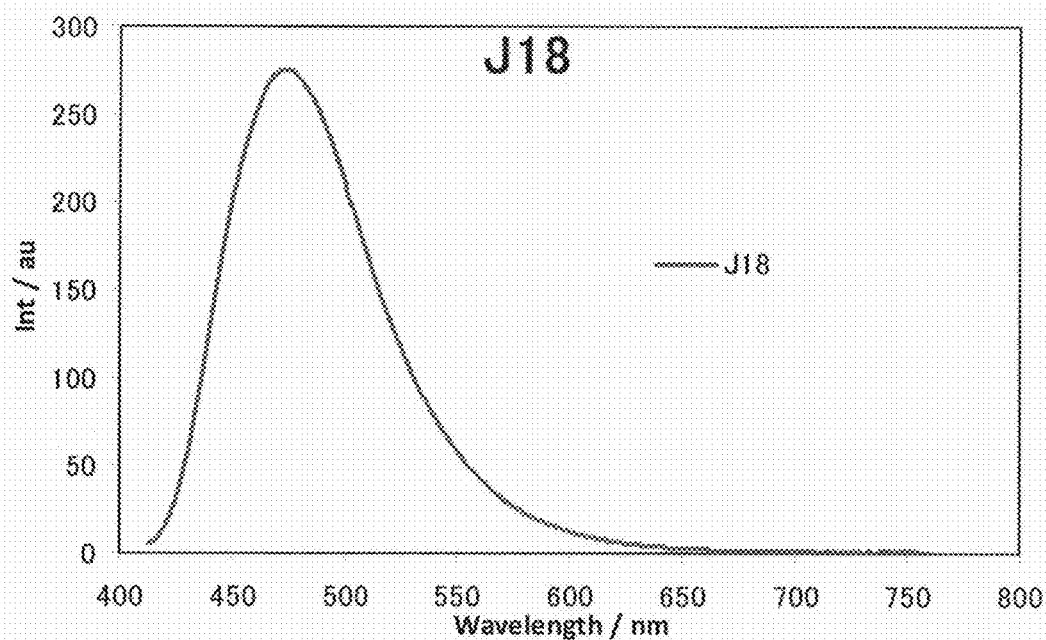

Starting materials, $Eu_2O_3$, $BaCO_3$, $SrCO_3$, $Mg_2(OH)_2CO_3$, $(NH_4)_2HPO_4$, $BaCl_2.2H_2O$, $SrCl_2.6H_2O$ were weighted such that the final molar ratio of Eu:Ba:Sr:Mg:P:Cl was 0.6:7.9:1.45:0.05:6:2, and mixed by use of a mortar. The mixture was placed in a crucible made of alumina and kept in an electric furnace at 900° C. for 2 hours in the atmosphere, ground, sieved, and further kept in a nitrogen atmosphere containing 5% hydrogen gas at 1150° C. for 5 hours for calcination. The calcined product was washed with water, dried and classified to obtain a blue-green light-emitting phosphor (phosphor J18). The X-ray diffraction pattern of the phosphor was measured by using an X ray diffraction device (XRD6100, manufactured by Shimadzu Corporation) employing CuKα ray as a radiation source. The results are shown in FIG. 20A. Light-emitting properties of the phosphor excited at 400 nm were measured by a fluorescence spectrophotometer (FP6500, Manufactured by JASCO). The results are shown in FIG. 20B.

Subsequently, as an LED chip, a commercially available chip (400 nm) was used and embedded in a commercially available silicon resin consisting of BCA (J18): β-SiAlON: SCASN=100:17:50 to obtain a white-light-emitting device (white LED light-emitting device) having a structure shown in FIG. 19. Current was applied to the white-light-emitting device and the emission spectrum and color-rendering property were evaluated.

Figure 21:
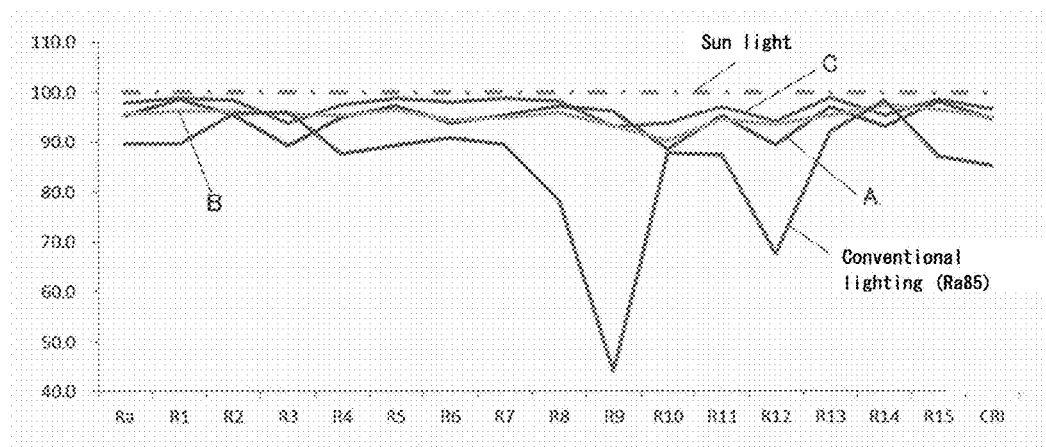
FIG. 21 is a graph showing measurement results of color-rendering property of light from a white-light-emitting device using a blue-green light-emitting phosphor of the present invention.

The measurement results of the color-rendering property of the white-light-emitting device using each of phosphor resin mixtures A, B, C are shown in Table 7 and FIG. 21. The color-rendering property refers to an index indicating the effect of a light-source spectrum on the color appearance of an object. The color-rendering property can be quantitatively evaluated by converting the difference of the light of interest from sun light into a numerical value (sun light is specified as a reference value of 100). Note that, as the general color-rendering index (Ra) or color-rendering index (CRI) becomes closer to 100, the color-rendering property is evaluated to be high. Note that an average color-rendering index (Ra) of general interior illumination is about 80.

From the results, it was confirmed that, in the white-light-emitting device, the color temperature of white light changes depending on the degree of a blue green component contained in a blue-green light-emitting phosphor (BCA) emitting blue-green light and thereby, white light having high color-rendering property can be realized without additionally using other blue phosphors, as shown in the results of the phosphor resin mixtures B and C (as to color temperature, mixture B: neutral white, mixture C: warm white). Also, in the white-light-emitting device, a conventional blue phosphor can be mixed in addition to the blue-green light-emitting phosphor (BCA) obtained, as shown in the results of the phosphor resin mixture A. From this, it was found that a white light phosphor having high color-rendering property in a further wider color temperature range can be obtained by using various phosphors in combination (for example, white-light-emitting device, which emits cold white light having a color temperature of 10000K, can be realized by selecting blue phosphors and optimally mixing them).

In the following table 7 and FIG. 21, R1, R2, R3, . . . R15 are called as special color-rendering indexes and show reproducibility of individual test colors and calculated as a general color-rendering index: (Ra)=(ΣR1 to 8)/8,
And, as a color-rendering index:

(CRI)=(ΣR1 to 15)/15.

Also, in FIG. 21, the results of Comparative Example using a conventional commercially available illuminating device (Ra value: 85) are also shown.

TABLE 7

| Phosphor | Color temperature | Ra | R1 | R2 | R3 | R4 | R5 | R6 | R7 | R8 |
|---|---|---|---|---|---|---|---|---|---|---|
| C | 3200 | 97.8 | 98.7 | 98.4 | 93.7 | 97.6 | 98.8 | 98.1 | 98.8 | 98.3 |
| A | 5500 | 95.3 | 98.6 | 95.4 | 89.4 | 94.8 | 97.4 | 93.7 | 95.3 | 97.4 |
| B | 5500 | 95.6 | 96.2 | 96.1 | 95.6 | 95.3 | 96.4 | 94.3 | 95.0 | 95.8 |

| Phosphor | Color temperature | R9 | R10 | R11 | R12 | R13 | R14 | R15 | CRI |
|---|---|---|---|---|---|---|---|---|---|
| C | 3200 | 93.0 | 93.8 | 97.2 | 94.1 | 99.0 | 95.4 | 98.6 | 96.8 |
| A | 5500 | 96.3 | 88.6 | 95.3 | 89.5 | 97.2 | 93.2 | 98.3 | 94.7 |
| B | 5500 | 93.2 | 90.3 | 94.6 | 93.5 | 95.4 | 97.4 | 96.6 | 95.0 |

From the results, it was confirmed that the white-light-emitting devices using the phosphor resin mixture A, B and C each exhibit extremely high color-rendering property (a general color-rendering index (Ra) or color-rendering index (CRI) of 95 or more). Further, from the results shown in FIG. 21, the following excellent property was confirmed: in the white-light-emitting devices using the phosphor resin mixture A, B and C, the special color-rendering index (R1, R2, R3, . . . R15) of individual colors maintain high values on average, compared to the results of a conventional commercially available illuminating device (Ra value: 85); in other words, the device can stably provide high color-rendering property to any color.

Figure 22:
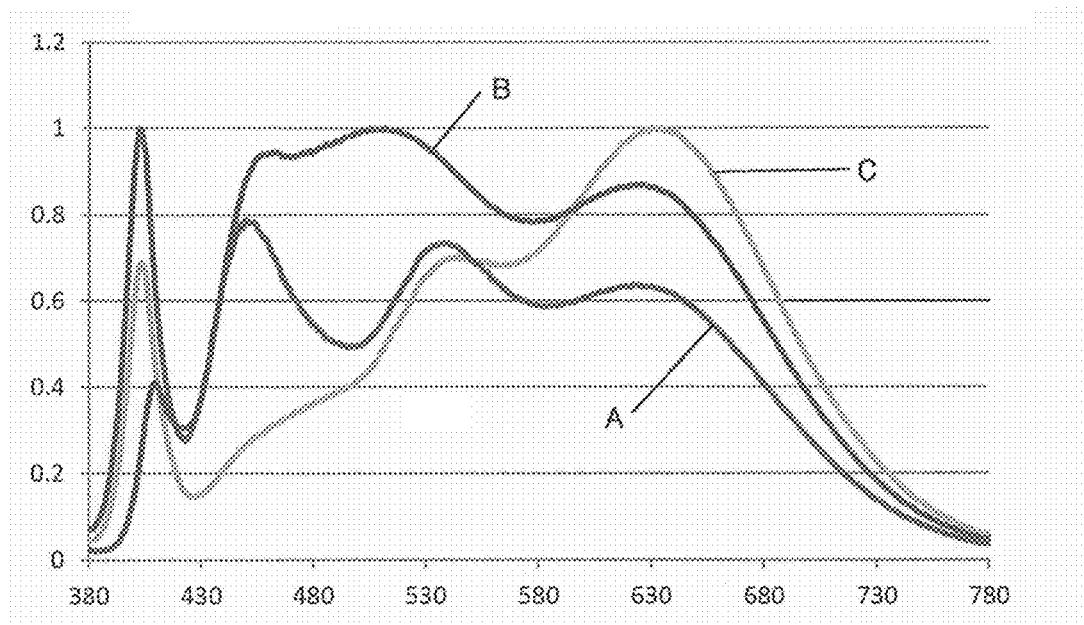
FIG. 22 is a graph showing emission spectra of light from white-light-emitting devices using the blue-green light-emitting phosphors of the present invention.

Also, the emission spectra of the white-light-emitting devices using the phosphor resin mixture A, B and C are shown in FIG. 22. From the result, it was found that the spectra of the white-light-emitting devices are moderate and uniform over a wide band width. It was confirmed that the white-light-emitting devices have excellent light-emitting properties.

REFERENCE SIGNS LIST

1 Phosphor resin mixture
2 Chip
3 Reflector
4 Lead frame
5 Bonding wire

The invention claimed is:

1. A blue-green light-emitting phosphor constituted of a plurality of alkaline earth metal elements including a barium element, phosphoric acid and a halogen element, and Eu as an activator, wherein a molar ratio of the barium element to a total content of the alkaline earth metal elements is larger than 60% and smaller than 95%, and upon irradiation with a near-ultraviolet ray, the blue-green light-emitting phosphor is excited to thereby emit blue-green visible light.

2. The blue-green light-emitting phosphor according to claim 1, represented by a general formula:

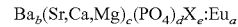

$Ba_b(Sr,Ca,Mg)_c(PO_4)_dX_e:Eu_a$ where X represents a halogen element, $0<a<1.5$, $9.5 \leq a+b+c \leq 10.5$, $5.4 \leq d \leq 6.6$, $1.8 \leq e \leq 2.2$, $0.6 < b/(b+c) < 0.95$.

3. The blue-green light-emitting phosphor according to claim 1, wherein
50 mol % or more of the halogen element is constituted of a chlorine element.

4. The blue-green light-emitting phosphor according to claim 1, comprising at least one co-activating element selected from the group of rare earth metals and transition metals consisting of Sc, Y, La, Gd, Tb, Lu, Pr, Ce, Cr, V, Mn and Zn.

5. A blue-green light-emitting phosphor, comprising the blue-green light-emitting phosphor according to claim 4 in an amount of 10 to 90 wt % and at least one phosphor selected from the group of blue phosphors and green phosphors consisting of $BaMgAl_{10}O_{17}$:Eu, $(Ba,Sr)_3MgSi_3O_8$:Eu, $Sr_{10}(PO_4)_6Cl_2$:Eu, $Sr_2P_2O_7$:Eu, $Ca_2PO_4Cl$:Eu, $Ba_2PO_4Cl$:Eu and $(Ba,Sr,Ca)Al_2O_4$:Eu.

6. A light-emitting element comprising the blue-green light-emitting phosphor according to claim 1.

7. A light-emitting device comprising the blue-green light-emitting phosphor according to claim 1.

8. A white-light-emitting device emitting white light, comprising the blue-green light-emitting phosphor according to claim 1, a red phosphor and a green phosphor.

9. A white-light-emitting device, comprising
a first phosphor, which is the blue-green light-emitting phosphor according to claim 1, and emits blue-green light of 430 to 500 nm,
a second phosphor emitting green to yellow light of 500 to 580 nm,
a third phosphor emitting red to deep red light of 580 to 700 nm, and
an LED element emitting near-ultraviolet light of 350 to 430 nm; wherein
the first phosphor, second phosphor and third phosphor are directly or indirectly excited by light from the LED element to emit white light.

10. The white-light-emitting device according to claim 9, having a general color-rendering index (Ra) or color-rendering index (CRI) of 95 or more.

11. The white-light-emitting device according to claim 9, wherein
the second phosphor comprises a Eu-activated alkaline earth silicate-based phosphor or an alkaline earth silicate nitride-based phosphor.

12. The white-light-emitting device according to claim 11, wherein the second phosphor comprises at least one of $(Ba,Sr,Ca,Mg)_2SiO_4$:Eu (BOSE), $Si_{6-z}Al_zO_zN_{8-z}$ (β SiAlON), $(Ba,Sr)Si_2O_2N_2$, $(Ba,Sr,Ca)MgAl_{10}O_{17}$:$Eu^{2+}$,$Mn^{2+}$ (BAMN) and $(Ca,Sr)_8Mg(SiO_4)_4Cl_2$:Eu.

13. The white-light-emitting device according to claim 9, wherein the third phosphor comprises at least one of a Eu-activated alkaline earth oxynitride-based phosphor, a Eu-activated alkaline earth silicate-based phosphor and a Mn-activated fluoride complex red phosphor.

14. The white-light-emitting device according to claim 13, wherein the third phosphor comprises at least one of $(Ba,Sr,Ca)_3SiO_5$:Eu, $(Ba,Sr,Ca)_2(Si,Al)_5N_8$:Eu, $(Ca,Sr)AlSi(O,N)_3$, $K_2(Si,Ge,Ti)F_6$:$Mn^{4+}$ (KSF), $Li(Eu,RE)W_2O_8$ (where RE includes at least one of Sc, Y, La, Gd and Lu) (LEW).

* * * * *